United States Patent
Ooishi

(10) Patent No.: US 7,277,330 B2
(45) Date of Patent: Oct. 2, 2007

(54) NONVOLATILE SEMICONDUCTOR MEMORY DEVICE HAVING IMPROVED REDUNDANCY RELIEVING RATE

(75) Inventor: Tsukasa Ooishi, Hyogo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 0 days.

(21) Appl. No.: 11/409,121

(22) Filed: Apr. 24, 2006

(65) Prior Publication Data

US 2006/0187723 A1    Aug. 24, 2006

Related U.S. Application Data

(62) Division of application No. 11/145,980, filed on Jun. 7, 2005, now Pat. No. 7,061,800, which is a division of application No. 10/357,411, filed on Feb. 4, 2003, now abandoned.

(30) Foreign Application Priority Data

Aug. 22, 2002    (JP) .............................. 2002-241808

(51) Int. Cl.
    *G11C 7/10*       (2006.01)
(52) U.S. Cl. .................. 365/189.01; 365/200; 365/210
(58) Field of Classification Search ................ 365/158, 365/171, 200, 210, 209, 230.07, 189.01, 365/109
See application file for complete search history.

(56) References Cited

U.S. PATENT DOCUMENTS

| | | |
|---|---|---|
| 5,469,388 A | 11/1995 | Park |
| 5,892,718 A | 4/1999 | Yamada |
| 5,978,290 A | 11/1999 | Fujita |
| 6,292,383 B1 * | 9/2001 | Worley .......................... 365/69 |
| 6,304,498 B1 | 10/2001 | Ikeda |
| 6,404,683 B1 * | 6/2002 | Yumoto ....................... 365/200 |
| 6,639,854 B2 | 10/2003 | Hur et al. |
| 6,661,700 B2 | 12/2003 | Taniguchi |
| 6,778,432 B2 | 8/2004 | Ohtani |

(Continued)

FOREIGN PATENT DOCUMENTS

JP    4-98679    3/1992

(Continued)

OTHER PUBLICATIONS

Roy Scheuerlein et al., "A 10ns Read and Write Non-Volatile Memory Array Using a Magnetic Tunnel Junction and FET Switch In Each Cell", Feb. 2000, pp. 94-95, 128-129, 409-410, ISSCC DIgest of Technical Papers, TA7.2

(Continued)

*Primary Examiner*—Anh Phung
*Assistant Examiner*—Dang Nguyen
(74) *Attorney, Agent, or Firm*—Buchanan Ingersoll & Rooney PC

(57) ABSTRACT

In a memory cell array of an MRAM, a normal memory cell is compared with a reference memory cell which holds a reference value, thereby storing data of one bit per cell. Two spare memory cells store data of one bit as a whole. By writing complementary values to the two spare memory cells and connecting these spare memory cells to a sense amplifier, the stored data of one bit is read. A spare memory cell section which is often arranged in an array peripheral portion becomes more resistant against a variation in finished dimensions of elements and a success rate for replacing and relieving a defective memory cell by a spare memory cell increases.

2 Claims, 17 Drawing Sheets

U.S. PATENT DOCUMENTS

| | | |
|---|---|---|
| 6,865,103 B2 | 3/2005 | Hidaka |
| 2003/0007384 A1 | 1/2003 | Shimizu |

FOREIGN PATENT DOCUMENTS

| | | |
|---|---|---|
| JP | 9-223780 | 8/1997 |

OTHER PUBLICATIONS

M. Durlam et al., "Nonvolatile RAM Based on Magnetic Tunnel Junction Elements", Feb. 2000, pp. 96-97, 130-131, 410-411, ISSCC Digest of Technical Papers, TA7.3.

* cited by examiner

NONVOLATILE SEMICONDUCTOR MEMORY DEVICE HAVING IMPROVED REDUNDANCY RELIEVING RATE

This application is a divisional of application Ser. No. 11/145,980, filed Jun. 7, 2005, which in turn is a divisional of application Ser. No. 10/357,411, filed on Feb. 4, 2003, now abandoned.

BACKGROUND OF THE INVENTION

1. Field of the Invention

The present invention relates to a nonvolatile semiconductor memory device, and more particularly to a nonvolatile semiconductor memory device including a spare memory cell for replacing a defective memory cell

2. Description of the Background Art

For a semiconductor memory device which executes data storage, various data storage formats are employed to store data in memory cells. For example, there is provided a semiconductor memory device constituted so that the pass current of each memory cell changes according to data stored in the memory cell when the memory cell is accessed. In the semiconductor memory device of this type, the data stored in a selected memory cell is read in accordance with the comparison between the pass current of the selected memory cell to be accessed and a preset reference current. As semiconductor memory devices having such memory cells, attention is being paid to an MRAM Magnetic Random Access Memory) device capable of executing the storage of nonvolatile data with low power consumption.

Recently, in particular, it has been made public that the performance of an MRAM device dramatically-advances by employing thin film magnetic elements using MTJs (Magnetic Tunnel Junctions) as memory cells. The MRAM device which includes memory cells each having the MTJs is disclosed, for example, in the following technical documents:

Roy Scheuerlein and six others, "A 10 ns Read and Write Non-Volatile Memory Array Using a Magnetic Tunnel Junction and FET Switch in each Cell", ISSCC Digest of Technical Papers, February 2000, TA7.2, pp. 94-95, 128-129 and 409.

M. Durlam and five others, "Nonvolatile RAM based on Magnetic Tunnel Junction Elements", ISSCC Digest of Technical Papers, February 2000, TA7.3, pp. 96-97.

FIG. 18 is a schematic diagram showing a configuration of a memory cell which has a tunnel junction (hereinafter, also simply referred to as "MTJ memory cell").

With reference to FIG. 18, the MTJ memory cell includes a tunneling magneto-resistance element TMR having electric resistance which changes in accordance with the data level of magnetically written storage data, and an access transistor ATR. Access transistor ATR is connected in series to tunneling magneto-resistance element TMR between a write bit line WBL and a read bit line RBL. As access transistor ATR, a field effect transistor formed on a semiconductor substrate is typically employed.

For the MTJ memory cell, write bit line WBL and write digit line WDL each for carrying data write currents in different directions during data write, a word line WL for instructing data read, and read bit line RBL receiving the supply of the data read currents are provided. During data read, in response to turning on access transistor ATR, tunneling magneto-resistance element TMR is electrically coupled between write bit line WBL set at a ground voltage GND and read bit line RBL.

FIG. 19 is a conceptual view for describing a data write operation for writing data to the MTJ memory cell.

With reference to FIG. 19, tunneling magneto-resistance element TMR includes a ferromagnetic material layer FL which has a fixed constant magnetic direction (hereinafter, also simply referred to as "fixed magnetic layer") and a ferromagnetic material layer VL which is magnetized in a direction according to a magnetic field applied from externally (hereinafter, also simply referred to as "free magnetic layer"). A tunneling barrier (tunneling film) TB formed from an insulating film is provided between fixed magnetic layer FL and free magnetic layer VL. Free magnetic layer VL is magnetized in the same direction or the opposite direction to that of fixed magnetic layer FL in accordance with the level of stored data to be written. Fixed magnetic layer FL, tunneling barrier TB and free magnetic layer VL form a magnetic tunnel junction.

The electric resistance of tunneling magneto-resistance element TMR changes according to the relative relationship between the magnetic direction of fixed magnetic layer FL and that of free magnetic layer VL. Specifically, if the magnetic direction of fixed magnetic layer FL is parallel to that of free magnetic layer VL, the electric resistance value of tunneling magneto-resistance element TMR is a minimum value Rmin. If these magnetic directions are opposite (non-parallel) to each other, the electric resistance value of tunneling magneto-resistance element TMR is a maximum value Rmax.

During data write, word line WL is deactivated and access transistor ATR is turned off. In this state, a data write current for magnetizing free magnetic layer VL is carried to each of bit line BL and write digit line WDL in a direction according to the level of the write data.

FIG. 20 is a conceptual view for describing the relationship between the data write current and the magnetic direction of a tunneling magneto-resistance element during data write.

With reference to FIG. 20, the horizontal axis indicates a magnetic field applied in an easy axis (EA: Easy Axis) direction in free magnetic layer VL in tunneling magneto-resistance element TMR. The vertical axis H(HA) indicates a magnetic field applied in a hard axis (HA: Hard Axis) direction in free magnetic layer VL. Magnetic fields H(EA) and H(HA) correspond to two magnetic fields generated by currents carried to bit line BL and write digit line WDL, respectively.

In the MTJ memory cell, the fixed magnetic direction of fixed magnetic layer FL is along the easy axis of free magnetic layer VL. Free magnetic layer VL is magnetized in a direction parallel or non-parallel (opposite) to fixed magnetic layer FL along the easy axis direction in accordance with the level of stored data ("1" or "0"). The MTJ memory cell can store 1-bit data ("1" and "0") corresponding to the two magnetic directions of free magnetic layer VL.

The magnetic direction of free magnetic layer VL can be rewritten only when the sum of magnetic fields H(EA) and H(HA) applied to free magnetic layer VL reaches a region outside of an asteroid characteristic line shown in FIG. 20. In other words, when the data write magnetic field applied to free magnetic layer VL has an intensity corresponding to the region inside of the asteroid characteristic line, the magnetic direction of free magnetic layer VL has no change.

As shown in the asteroid characteristic line, if a magnetic field in the hard axis direction is applied to free magnetic layer VL, it is possible to decrease a magnetc threshold necessary to change the magnetic direction of free magnetic layer VL along the easy axis.

If operation points during data write are designed as shown in the example of FIG. 20, the data write magnetic field in the easy axis direction is designed so as to have an intensity of $H_{WR}$ in the MTJ memory cell to which the data is to be written. That is, the value of the data write current carried to each of bit line BL and write digit line WDL is designed so as to obtain this data write magnetic field $H_{WR}$. Generally, data write magnetic field $H_{WR}$ is expressed by the sum of a switching magnetic field $H_{SW}$ necessary to change over a magnetic direction and a margin $\Delta H$, i.e., $H_{WR}=H_{SR}+\Delta H$.

In order to rewrite the stored data of the MTJ memory cell, i.e., to rewrite the magnetic direction of tunneling magneto-resistance element TMR, it is necessary to carry a data write current at predetermined level or higher to each of write digit line WDL and bit line BL. Thereby, free magnetic layer VL in tunneling magneto-resistance element TMR is magnetized in the direction parallel or opposite (non-parallel) to that of fixed magnetic layer FL in accordance with the direction of the data write magnetic field along the easy axis (EA). The magnetic direction which is written to tunneling magneto-resistance element TMR once, i.e., the stored data of the MTJ memory cell is held in a nonvolatile manner until new data is written.

FIG. 21 is a conceptual view for describing a data read operation for reading data from the MTJ memory cell.

With reference to FIG. 21, during data read, access transistor ATR is turned on in response to the activation of word line WL. Write bit line WBL is set at ground voltage GND. As a result, tunneling magneto-resistance element TMR is electrically coupled to read bit line RBL while being pulled down at ground voltage GND.

In this state, if read bit line RBL is pulled up at a predetermined voltage, a memory cell current Icell according to the electric resistance of tunneling magneto-resistance element TMR, i.e., according to the level of the stored data in the MTJ memory cell, passes through a current path which includes read bit line RBL and tunneling magneto-resistance element TMR. By comparing this memory cell current Icell with a predetermined current, for example, it is possible to read the data stored in the MTJ memory cell.

As described above, the electric resistance of tunneling magneto-resistance element TMR changes according to the magnetic direction which can be rewritten by the data write magnetic field applied thereto. Therefore, if electric resistance values Rmax and Rmin of tunneling magneto-resistance element TMR are made to correspond to the levels ("1" and "0") of the stored data, respectively, it is possible to store nonvolatile data.

An MRAM of 1 transistor-1 MTJ element type as shown in FIG. 18, however, sometimes causes a malfunction depending on the finished states of memory cell elements. Due to this, redundant memory cells are often provided in preparation for an instance in which a failure such as a malfunction generates to a normal memory cell. If a defective memory cell is discovered and this defective memory cell is replaced by a spare memory cell, a chip which has been determined to be a failure chip once can be relieved.

Nevertheless, the spare memory cells are often provided in a portion peripheral of a memory cell array. If the spare memory cells are located in such a peripheral portion, the finished dimensions of elements tend to exhibit a wide range of variation compared with the central portion of the memory cell array. If a spare memory cell is defective, a chip cannot be relieved even by replacing a defective memory cell by the spare memory cell.

SUMMARY OF THE INVENTION

It is an object of the present invention to provide a nonvolatile semiconductor memory device capable of improving the reliability of a spare memory cell and operating at high rate.

In short, the present invention provides a nonvolatile semiconductor memory device including: a plurality of normal memory cells each storing data of one bit in a nonvolatile manner; a plurality of spare memory cells each used in place of a defective memory cell when the defective memory cell is present in the plurality of normal memory cells, and constituted so that two spare memory cells store data of one bit as a whole; a control circuit, in accordance with an external access, selecting a first memory cell group corresponding to an address signal from among the plurality of normal memory cells and selecting a second memory cell group from among the plurality of spare memory cells in parallel to selection of the first memory cell group; and a select and amplification section selecting a read memory cell group in accordance with the address signal from among the first and second memory cell groups, and amplifying and outputting the data held in the read memory cell group.

Therefore, a main advantage of the present invention is as follows. Since the two spare memory cells store data of one bit as a whole, a spare memory cell section which is often arranged in an array peripheral portion becomes more resistant against a variation in finished dimensions of elements and a success rate for replacing and relieving a defective memory cell by a spare memory cell increases.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
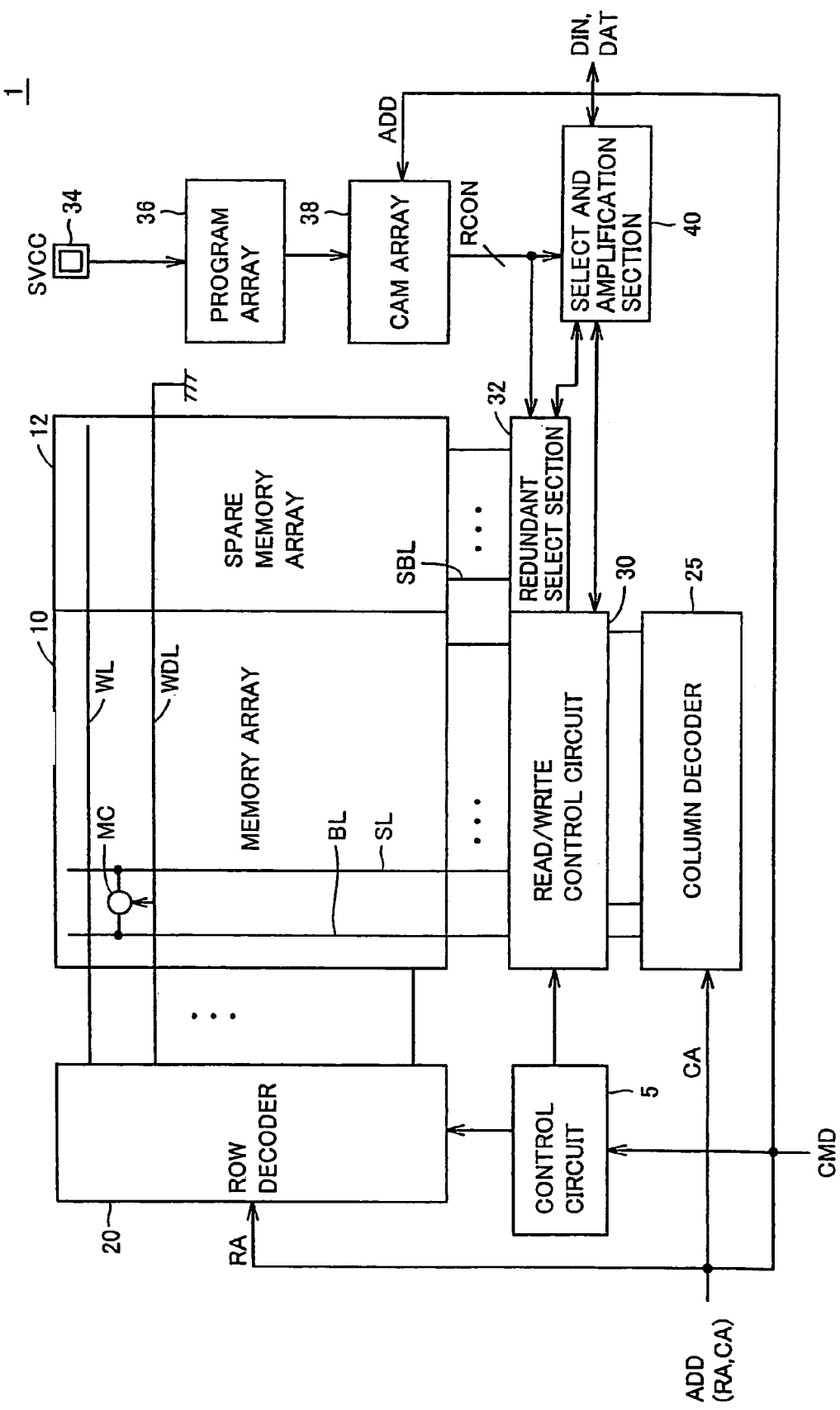
FIG. 1 is a schematic block diagram showing the configuration of a nonvolatile semiconductor memory device 1 according to a first embodiment of the present invention.

Hereinafter, embodiments of the present invention will be described in detail with reference to the drawings. It is noted that the same or corresponding elements are denoted by the same reference symbols in the drawings.

First Embodiment

FIG. 1 is a schematic block diagram showing the configuration of a nonvolatile semiconductor memory device 1 according to a first embodiment of the present invention.

With reference to FIG. 1, nonvolatile semiconductor memory device 1 randomly accesses a memory cell in response to an external control signal CMD and an external address signal ADD and executes the input of write data DIN and the output of read data DAT.

Nonvolatile semiconductor memory device 1 includes a control circuit 5 which controls the entire operation of nonvolatile semiconductor memory device 1 in accordance with control signal CMD, and a memory array 10 which includes MTJ memory cells MC arranged in a matrix.

In memory array 10, word lines WL and write digit lines WDL are arranged to correspond to the respective rows of the MTJ memory cells. In addition, bit lines BL and source lines SL are arranged to correspond to the respective columns of the MTJ memory cells MC. FIG. 1 typically shows the arrangement of one MTJ memory cell MC, and one word line WL, one write digit line WDL, one bit line BL and one source line SL correspond to MTJ memory cell MC.

Nonvolatile semiconductor memory device 1 also includes a row decoder 20 which decodes a row address RA shown by an address signal and executes row selection in memory array 10, a column decoder 25 which decodes a column address CA shown by address signal ADD and executes column selection in memory array 10, and a read/write control circuit 30.

Read/write control current 30 generically expresses a circuit for carrying a data write current to bit line BL during data write and a circuit for carrying a data read current to bit line BL during data read.

Nonvolatile semiconductor memory device 1 further includes a spare memory array 12 provided adjacent to memory array 10, and a redundancy select section 32. Spare memory array 12 shares word line WL and write digit line WDL with memory array 10. Redundancy select section 32 selects a part of a plurality of spare bit lines SBL included in spare memory array 12.

Further, nonvolatile semiconductor memory device 1 includes a pad 34 for applying a predetermined high potential SVCC from externally, a CAM (Content Addressable Memory) array 38 to which replacement address information is transferred from program array 36, and a select and amplification section 40.

The replacement address information which is held in program array 36 in a nonvolatile manner is transferred to CAM array 38 when a power supply is turned on. CAM array 38 compares the transferred replacement address information with input address information ADD at high rate, and outputs a control signal RCON. Redundancy select section 32 selects a part of a plurality of spare bit lines SBL in accordance with control signal RCON. Select and amplification section 40 selects read data transmitted from read/write control circuit 30 and redundancy select section 32 in accordance with control signal RCON and outputs read data DAT.

Control circuit 5, row decoder 20, column decoder 25, read/write control circuit 30, CAM array 38 and redundancy select section 32 form a select control circuit of nonvolatile semiconductor memory device 1 as a whole. This select control circuit selects a first memory cell group corresponding to address signal ADD from among a plurality of normal memory cells in accordance with an external access. In parallel to the selection of the first memory cell group, the select control circuit selects a second memory cell group from among a plurality of spare memory cells. By selecting spare memory cells in parallel to the normal memory cells, a read operation rate is accelerated.

Figure 2:
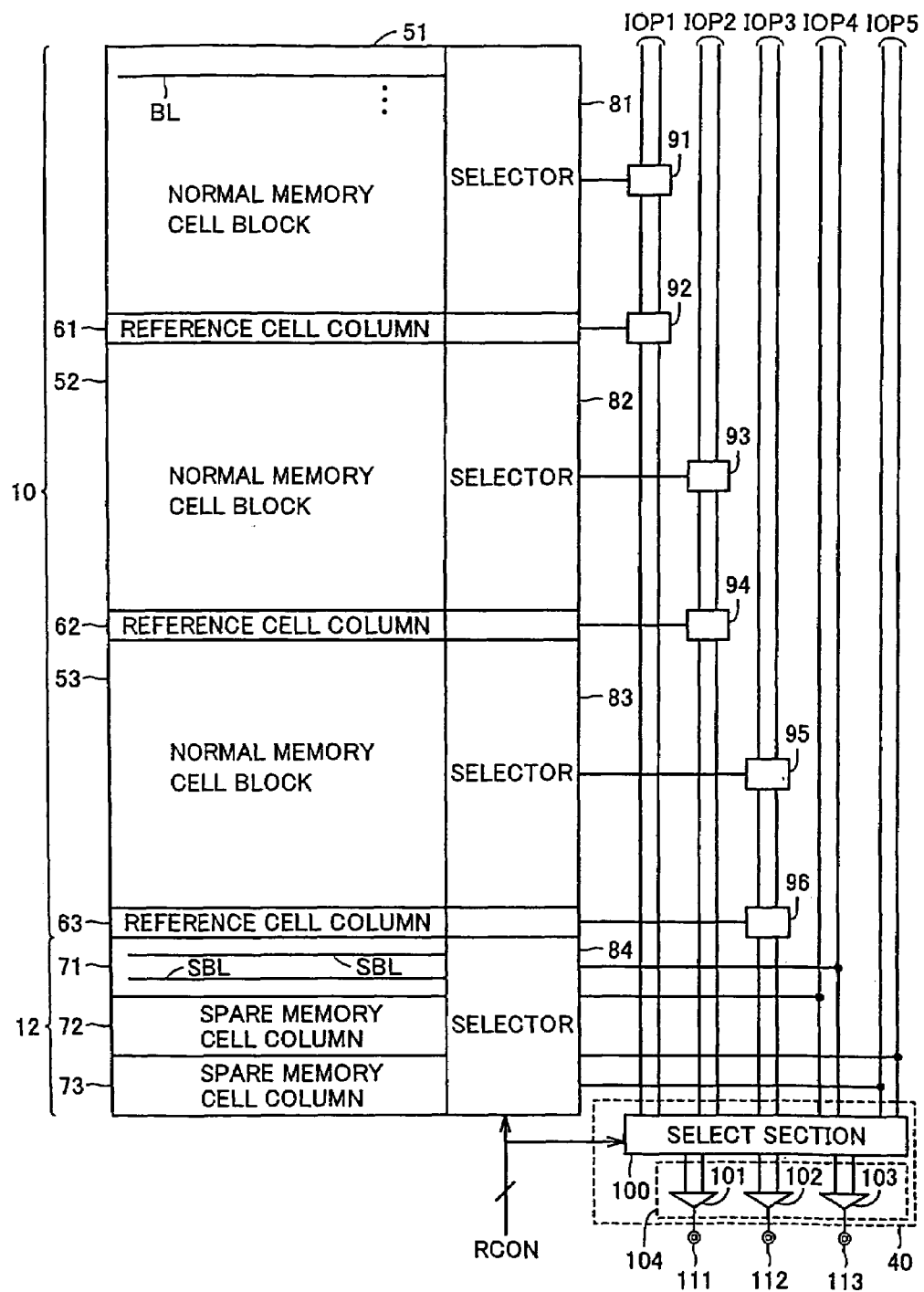
FIG. 2 is a block diagram for describing a data read system of nonvolatile semiconductor memory device 1 shown in FIG. 1.

FIG. 2 is a block diagram for describing a data read system of nonvolatile semiconductor memory device 1 shown in FIG. 1.

With reference to FIG. 2, memory array 10 includes normal memory cell blocks 51 to 53 and reference cell columns 61 to 63. The data read from normal memory cell blocks 51 to 53 is compared with a reference value which corresponds to an intermediate level between a high level and a low level held in reference cell columns 61 to 63, respectively, whereby the data stored in each memory cell is determined.

Spare memory array 12 includes spare memory cell columns 71 to 73. Two memory cells store data of one bit as a whole in each spare memory cell. Therefore, compared with normal memory cells each of which stores data of one bit, the reliability of the spare memory cells is improved.

Selectors 81 to 83 are provided to correspond to normal memory blocks 51 to 53, respectively. In addition, IO line pairs IOP1 to IOP3 are provided to correspond to normal memory cell blocks 51 to 53, respectively.

The output of selector 81 is connected to one of the IO lines in IO line pair IOP1 by a connection section 91, and that of reference cell column 61 is connected to the other IO line in 10 line pair IOP1 by a connection section 92.

The output of selector 82 is connected to one of the 10 lines in IO line pair IOP2 by a connection section 93, and that of reference cell column 62 is connected to the other IO line in IO line pair IOP2 by a connection section 94.

The output of selector 83 is connected to one of the IO lines in IO line pair IOP3 by a connection section 95, and that of reference cell column 63 is connected to the other IO line in IO line pair IOP1 by a connection section 96.

While FIG. 2 shows a case where the three IO line pairs and the three normal memory blocks are provided, the number of IO line pairs and that of normal memory blocks may be larger or smaller than 3 as long as the number of normal memory blocks is equal to that of the corresponding IO line pairs. An accessed memory cell in a normal memory cell block is connected to one of the IO line in an IO line pair, and a memory cell in the corresponding reference cell column is connected to the other IO line in the IO line pair.

A part of spare memory cell columns 71 to 73 are selected by a selector 84. Selector 84 selects two out of the three spare memory cell columns in accordance with control signal RCON outputted from CAM array 38 shown in FIG. 1, and connects the two selected spare cell columns to two IO line pairs IOP4 and IOP5 provided to be dedicated to the data transmission for the spare memory cells.

Each spare memory cell column is constituted so that two memory cells store data of one bit as a whole. Two spare bit lines SBL are provided per spare memory cell column. Selector 84 selects two out of the three spare memory cell columns to transmit data from these selected cell columns to spare column-dedicated IO line pairs IOP4 and IOP5. The selection of selector 84 is made in accordance with control signal RCON outputted from CAM array 38 which detects redundancy. A spare bit line to be used according to an input address is connected to the spare column-dedicated IO line pair by selector 84.

If the number of spare memory cell columns is set equal to that of spare column-dedicated IO line pairs, selector 84 may not be provided. In this case, the data from spare memory array 12 is all outputted up to a select section 100. Thereby, it is unnecessary to apply a redundancy detection result to the selector section of a bit line output section, which may possibly accelerate operation rate.

In the first embodiment, however, selector 84 is provided and selector 84 selects two out of the three spare memory cell columns when connecting the selected columns to the IO line pairs for the following reason. If the number of IO line pairs increases, the area of nonvolatile semiconductor memory device 1 disadvantageously increases by as much as the increased number of provided IO line pairs.

Selectors 81 to 83 and connection sections 91 to 96 shown in FIG. 2 correspond to a part of read/write control circuit 30 shown in FIG. 1. In addition, selector 84 corresponds to a part of redundancy select section 32 shown in FIG. 1. Thus, selected memory cells are connected to a total of five IO line pairs.

Five IO line pairs IOP1 to IOP5 are connected to select and amplification section 40. Select and amplification section 40 includes select section 100 which selects three out of five IO line pairs IOP1 to IOP5 in accordance with control signal RCON and sense amplifiers 101 to 103 for reading the data of the memory cells connected to the IO line pairs selected by select section 100. The number of sense amplifiers is set 3 equal to that of data necessary to be outputted to terminals 111 to 113.

The 10 line pair to which a defective memory cell detected by CAM array 38 shown in FIG. 1 is connected and the IO line pair connected to an unnecessary spare bit line are not connected to sense amplifiers 101 to 103. Sense amplifier 101 to 103 are connected to the memory cells which store data corresponding to inputted addresses through the corresponding IO line pairs.

If the memory cells connected to sense amplifiers 101 to 103 are normal memory cells, sense amplifiers 101 to 103 are also connected to a reference memory cell which is present in the corresponding reference cell column and compare current values carried to the two memory cells.

If the memory cells connected to sense amplifiers 101 to 103 are spare memory cells, sense amplifiers 101 to 103 compare current values carried to the two complementary memory cells.

As can be seen, in each spare memory cell column, two memory cells store data of one bit as a whole, dedicated IO line pairs for reading data from the spare memory cells are provided, and the spare memory cells are selected depending on which IO line pairs the sense amplifiers which detect current on the connected IO line pairs are connected to.

With such a configuration adopted, it is possible to improve the reliability of the spare memory section. In addition, it is possible to simultaneously read data from the normal memory cells and the spare memory cells and to thereby accelerate operation rate. Furthermore, by simultaneously reading up to the data from the IO line pairs provided outside of the memory cell array, it is possible to further accelerate the operation rate.

Figure 3:
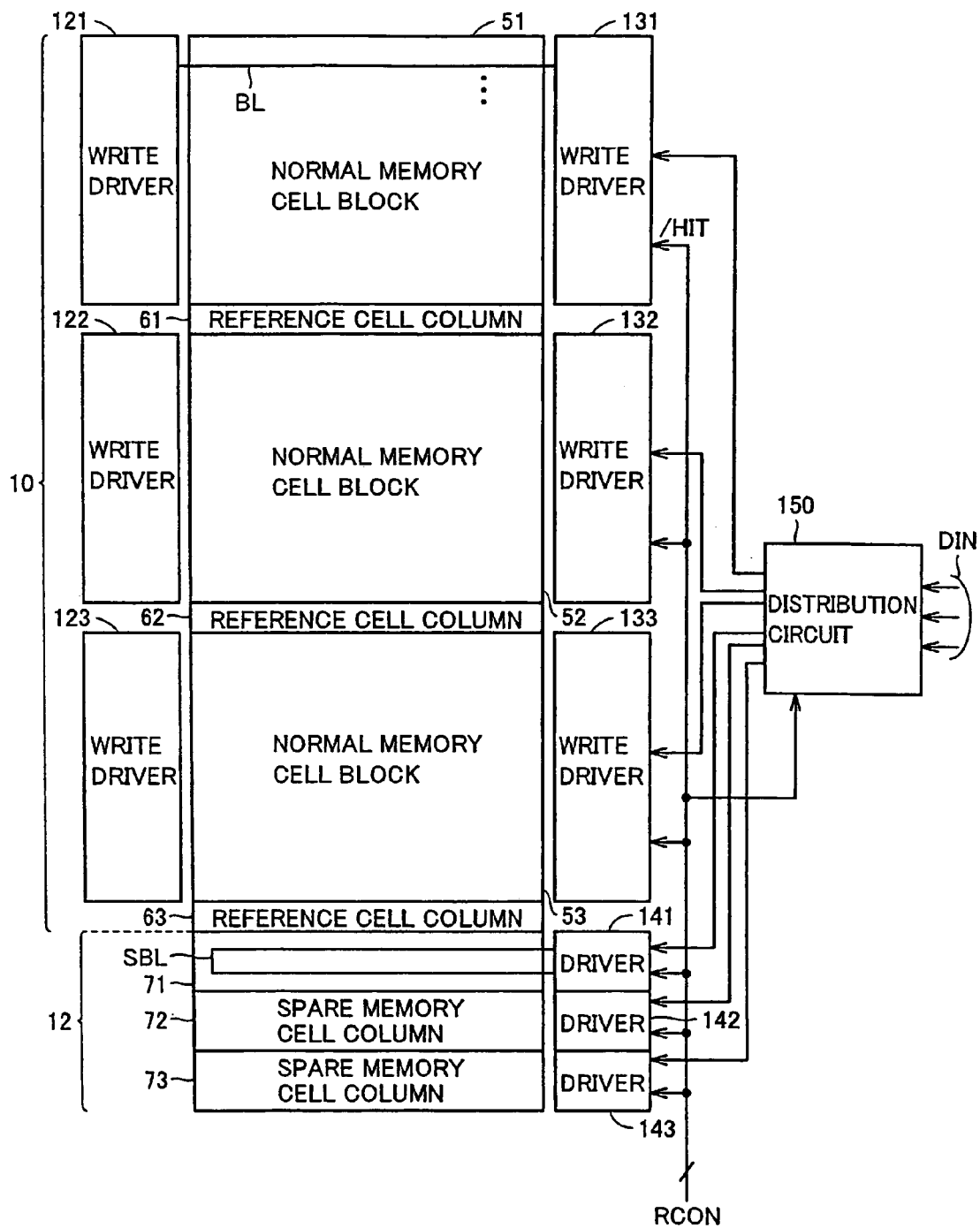
FIG. 3 is a block diagram for describing a data write system of nonvolatile semiconductor memory device 1 shown in FIG. 1.

FIG. 3 is a block diagram for describing a data write system of nonvolatile semiconductor memory device 1 shown in FIG. 1.

With reference to FIG. 3, if nonvolatile semiconductor memory device 1 is MRAM, a path for accessing the spare memory cell columns changes between data write and data read. The input data (three pieces of data in FIG. 3) are normally transmitted to write drivers 121 to 123 and 131 to 133 for corresponding blocks and each of the corresponding write drivers is controlled to carry a current to desired bit line BL.

If the addressed normal memory cell to which data is to be written is in a defective column which is to be relieved and replaced by a spare memory cell column, data is written to a spare memory cell in place of the normal memory cell.

Write data DIN is distributed to spare memory array 12 by a distribution circuit 150 based on control signal RCON which shows the redundancy detection result. At this moment, if the normal memory cell corresponding to the address signal is defective, the write driver corresponding to this defective memory cell is deactivated in the normal memory cell region. Among write drivers 141 to 143 provided for the spare region, the write driver corresponding to the spare memory cell to which data is to be written in place of the defective normal memory cell is activated. The write driver thus activated performs a data write operation in accordance with the data.

Each of the write drivers in the normal region may perform a data write operation even if its corresponding memory cell is a defective memory cell. In this embodiment, however, the write driver corresponding to the defective memory cell is deactivated with a configuration to be described later with reference to FIG. 5 so as to avoid increasing a write current.

Inputted write data DIN is distributed to memory array 10 or spare memory array 12 in accordance with control signal RCON showing the redundancy detection result. If the address to which write data DIN is to be written corresponds to the defective memory cell, distribution circuit 150 distributes write data DIN not to the corresponding normal memory block in the normal memory array but to spare memory cell columns 71 to 73. Further, corresponding one of write drivers 141 to 143 is activated.

Figure 4:
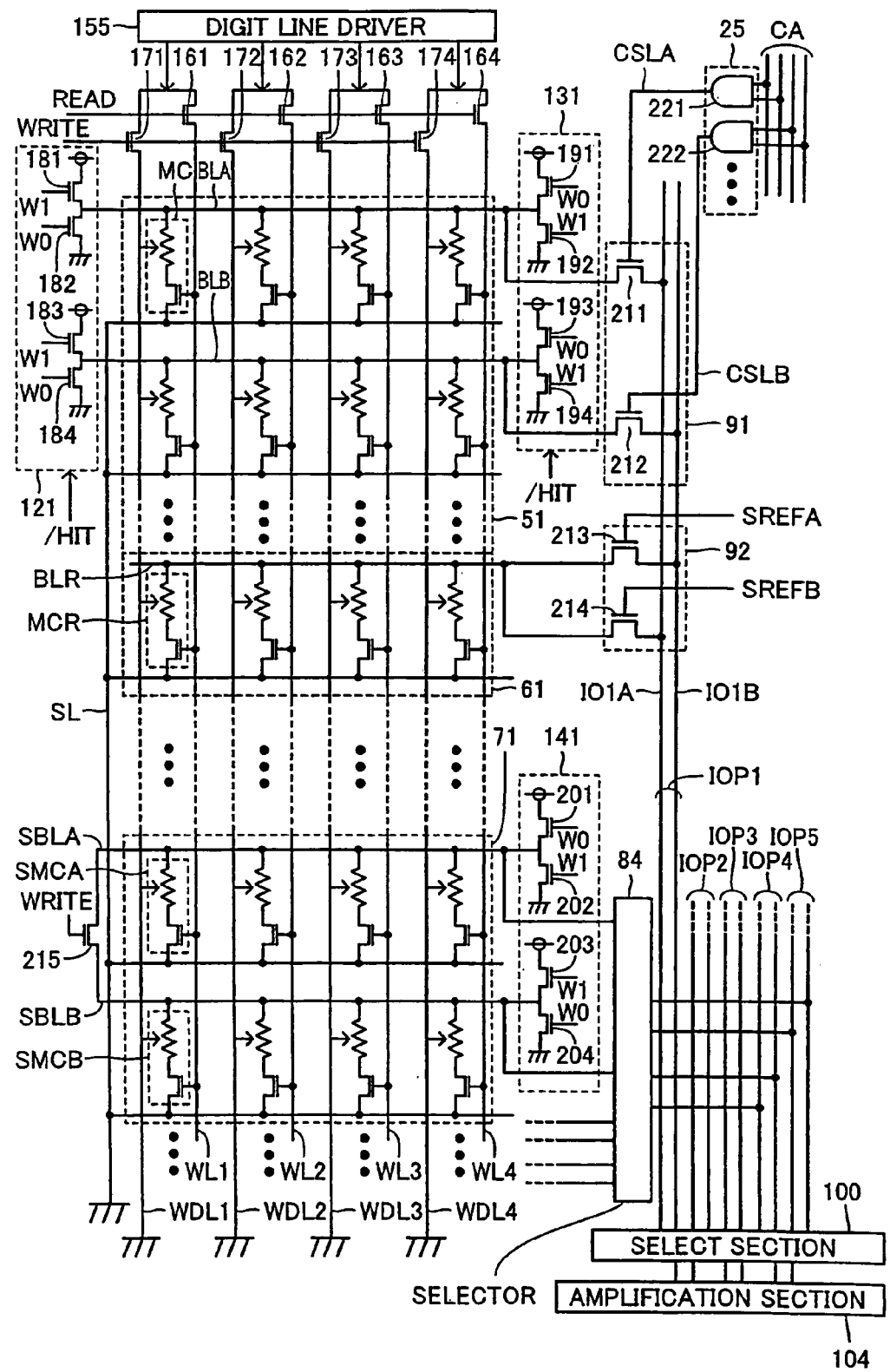
FIG. 4 is a circuit diagram showing the configurations of the read and write systems of nonvolatile semiconductor memory device 1 shown in FIGS. 2 and 3 in more detail.

FIG. 4 is a circuit diagram showing the configurations shown in FIGS. 2 and 3 in more detail.

FIG. 4 typically shows normal memory cell block 51, reference cell column 61, spare memory cell column 71 and their related circuits.

First, normal memory cells will be described. Normal memory cell block 51 includes memory cells MC arranged in a matrix. One memory cell MC stores data of one bit. Write drivers 121 and 131 for data write and connection section 91 for data read are connected to bit lines BLA and BLB. Write drivers 121 and 131 are arranged on the both ends of each of bit lines BLA and BLB.

The direction of a current carried to bit lines when data "0" is written to memory cell MC is opposite to that of a current carried thereto when data "1" is written to memory cell MC. Specifically, if data "1" is written to memory cell MC, a transistor 181 in write driver 121 is set conductive and a transistor 192 in write driver 131 is set conductive. Thereby, a current is carried across bit line BLA in a direction from write driver 121 to write driver 131.

On the other hand, when data "0" is written to memory cell MC, a transistor 191 in write driver 131 is set conductive and a transistor 182 in write driver 121 is set conductive. Thereby, a current is carried across bit line BLA in a direction from write driver 131 to write driver 121 likewise, for bit line BLB, transistors 183, 184, 193 and 194 are controlled based on write data DIN. In FIG. 4, reference symbol W1 denotes a signal which is activated when data "1" is written to memory cell MC and reference symbol W0 denotes a signal which is activated when data "0" is written thereto. As can be seen, the transistors in write drivers 121 are controlled to be activated in a reversed manner from the transistors in write drivers 131.

In a standby state, in both write drivers 121 and 131, the transistors may be activated to fix the potential of bit lines to ground potential GND or all of transistors 181 to 184 and 191 to 194 may be set nonconductive to turn the bit lines in a floating state.

Figure 5:
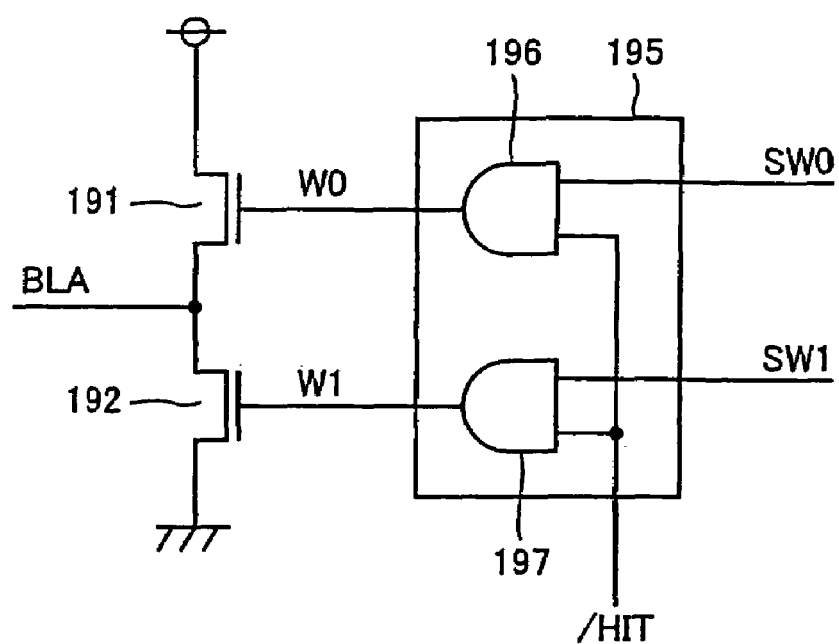
FIG. 5 is a circuit diagram for describing an example of a circuit which controls deactivation when a spare memory cell is selected in a write driver 131.

FIG. 5 is a circuit diagram for describing an example of a circuit in write driver 131, which controls deactivation when a spare cell is selected.

With reference to FIG. 5, a control unit 195 includes an AND circuit 196 which receives a control signal /HIT and a signal SW0, and an AND circuit 197 which receives control signal /HIT and a signal SW1. The output of AND circuit 196 is applied to the gate of transistor 191. The output of AND circuit 197 is applied to the gate of transistor 192. If CAM array 38 shown in FIG. 1 determines that the input address coincides with the address of a defective memory cell, the write drivers for the normal memory cells are deactivated to decrease power consumption. If control signal /HIT is deactivated to L level, the levels of outputs of AND circuits 196 and 197 become L level to thereby make both transistors 191 and 192 nonconductive. As a result, bit line BLA turns into a floating state.

With reference to FIG. 4 again, during data write, transistors 171 to 174 become conductive and transistors 161 to 164 become nonconductive. Further, digit line driver 155 activates one of digit lines WDL1 to WDL4 in accordance with a write address. At this time, a connection gate 215 connects a spare bit line SBLA to spare bit line SBLB.

During data read, transistors 161 to 164 become conductive and transistors 171 to 174 become nonconductive. Digit line driver 155 activates one of word lines WL1 to WL4 in accordance with a read address.

Connection section 91 includes a connection gate 211 which is provided between bit line BLA and an IO line IO1A and the gate of which receives a select signal CSLA, and a connection gate 212 which is provided between bit line BLB and an IO line IO1B and the gate of which receives a select signal CSLB. Select signal CSLA is outputted from a decoding circuit 221 included in column decoder 25 which decodes column address CA. Select signal CSLB is outputted from a decoding circuit 222 included in column decoder 25.

Reference cell column 61 includes reference memory cells MCR each of which stores a reference value for determining the data of corresponding normal memory cell MC. The write and read of the reference value to each reference memory cell MCR are performed in the same manner as those of data to each normal memory cell MC. However, during data read, the connection of the reference memory cell to the IO line is specially contrived. A bit line BLR corresponding to a reference memory cell column is connectable to both IO lines IO 1A and IO1B by connection section 92.

Connection section 92 includes a connection gate 213 which is connected between bit line BLR and IO line IO1B and the gate of which receives a control signal SREFA, and a connection gate 214 which is connected between bit line BLR and IO line IO1A and the gate of which receives a control signal SREFB.

Select signal SREFA is activated when select signal CSLA is activated. Thereby, if bit line BLA is connected to IO line IO1A, reference bit line BLR is connected to IO line IO1B. As a result, an amplification section 104 detects the difference in current value between a current carried to memory cell MC and that carried to memory cell MCR.

On the other hand, select signal SREFB is activated when select signal CSLB is activated. Therefore, if bit line BLB is connected to 10 line IO1B, bit line BLR is connected to IO line IO1A. The reason for connecting adjacent bit lines BLA and BLB to different IO lines is to uniformly distribute the junction capacities of connection gates 211 and 212 to the IO lines. In accordance with this rule, it is necessary to selectively connect reference bit line BLR to appropriate IO line.

Next, the spare memory cells will be described. In each spare memory cell column, two memory cells store data of one bit as a whole.

For example, complementary pieces of data are simultaneously written to two memory cells SMCA and SMCB selected by digit line WDL1. Due to this, write driver 141 driving the bit lines is arranged only one side of the memory array. Further, bit line SBLA and SBLB are connected to each other by connection gate 215 during data write.

If data "0" is written to a memory cell, transistors 201 and 204 are made conductive in write driver 141 and a current is carried from bit line SBLA to bit line SBLB. Conversely, if data "1" is written to a memory cell, transistors 202 and 203 are made conductive in write driver 141 and a current is carried from bit line SBLB to SBLA. Since bit lines SBLA and SBLB are connected to each other on one side by connection gate 215, the direction in which the current is carried to bit line SBLA and that in which the current is carried to bit line SBLB during data write are always opposite each other. As a result, complementary pieces of data are written to two spare memory cells selected by a digit line.

Spare memory cell columns 72 and 73, not shown, besides spare memory cell column 71 are arranged in nonvolatile semiconductor memory device 1. Selector 84 selects two out of the three spare memory cell columns to connect the selected spare memory cell columns to IO line pairs IOP4 and IOP5 dedicated to the data read operation for reading data from spare memory cells.

During data read, connection gate 215 does not connect bit lines SBLA and SBLB in spare memory cell column 71 and different currents are carried to spare memory cells SMCA and SMCB.

As shown in FIG. 4, in the memory cell arrays of MRAM, one normal memory cell stores data of one bit by comparing the normal memory cell with the reference memory cell which holds a reference value. Two spare memory cells store data of one bit as a whole. Namely, complementary pieces of data are written to two spare memory cells, respectively and the two spare memory cells are connected to a sense amplifier, thereby reading the stored data of one bit. By so constituting, the spare memory cell region which is often arranged in the peripheral portion of the memory cell array is more resistant against a variation in finished dimensions of elements and a success rate for replacing and relieving a defective memory cell by a spare memory cell thereby increases.

Figure 6:
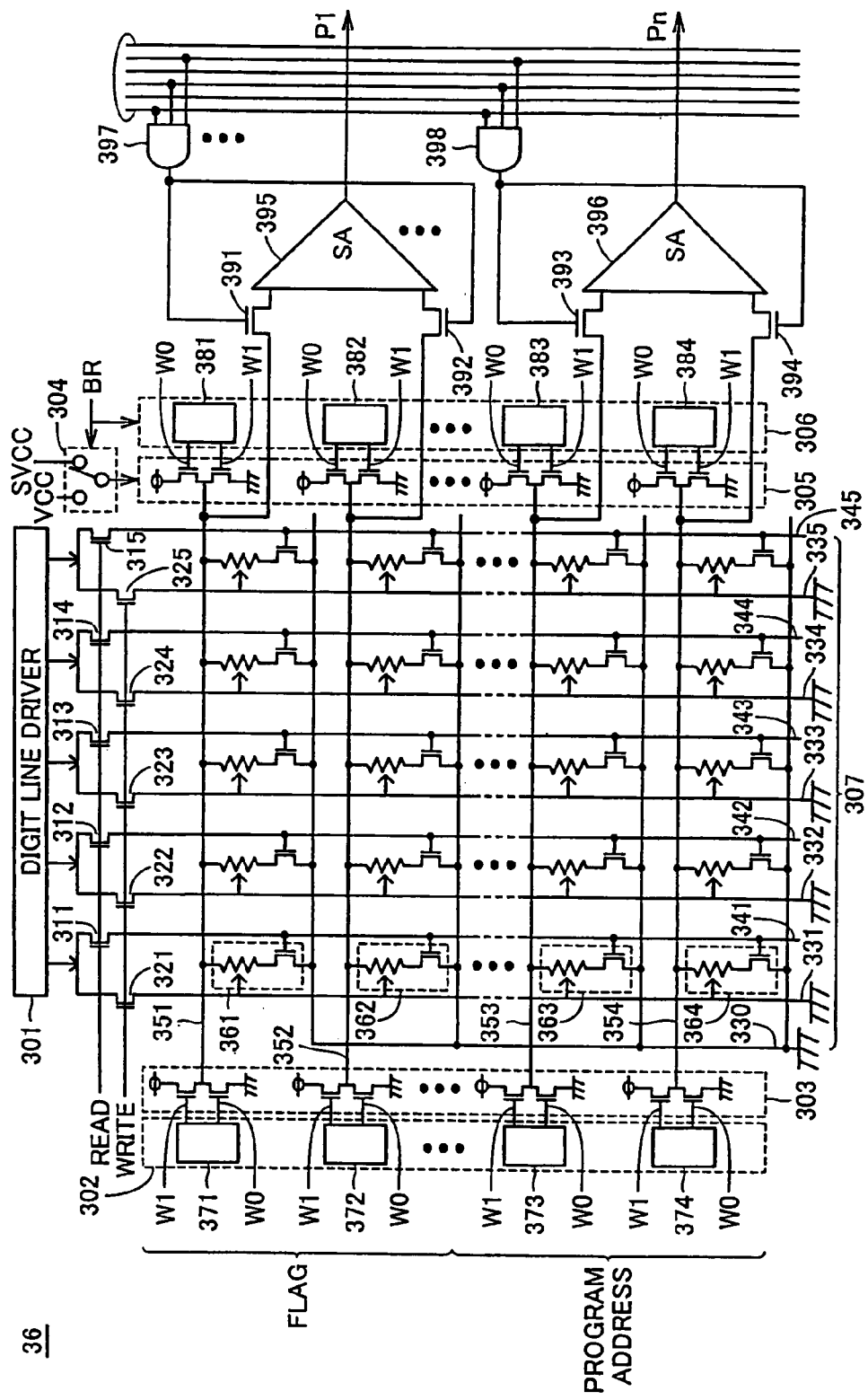
FIG. 6 is a circuit diagram showing the configuration of a program array 36 shown in FIG. 1.

FIG. 6 is a circuit diagram showing the configuration of program array 36 shown in FIG. 1.

With reference to FIG. 6, program array 36 includes a digit line driver 301, write drivers 303, 305, and control circuits 302 and 306 which control write drivers 303 and 305, respectively.

Program array 36 also includes bit lines 351 to 354, a source line 330, a write digit lines 331 to 335 and word lines 341 to 345.

Further, program array 36 includes MRAM memory cells 361 to 364 provided corresponding to digit line 331 and word line 341. Likewise, memory cells are arranged corresponding to the other word lines and digit lines and a memory cell array 307 is thereby constituted.

During data write, transistors 321 to 325 become conductive and digit line driver 301 selectively activates digit lines 331 to 335. During data read, transistors 311 to 315 become conductive and transistors 321 to 325 become nonconductive. Digit line driver 301 selectively activates word lines 341 to 345 during data read.

Memory cell columns connected to bit lines 351 and 352 correspond to a region which stores flags each indicating whether or not a program set is used. Program addresses are stored in the other region.

In the program array, two memory cells stores data of one bit as a whole so as to secure high reliability as in the case of the spare memory cell array. Data write is realized by, for example, writing complementary pieces of data to memory cells 361 and 362. At this moment, control circuits 302 and 306 control the directions of currents in accordance with write data. Reference symbol W1 denotes a gate which is activated when data "1" is written and W0 denotes a gate which is activated when data "0" is written.

Program array 36 further includes sense amplifiers 395 and 396 and control gates 391 to 394 which connect sense amplifiers to bit lines. If data is read from memory cells 361 and 362, connection gates 391 and 392 connect bit lines 351 and 352 to sense amplifier 395, respectively. If digit line driver.301 activates word line 341, sense amplifier 395 detects the difference between a current carried into source line 330 through memory cell 361 and a current carried into source line 330 through memory cell 362. A detection result is transferred, as a signal P1, to CAM array 38 shown in FIG. 1. Likewise, if data is read from memory cells 363 and 365, then connection gates 393 and 394 are made conductive, sense amplifier 396 detects a current difference and transfers a detection result, as a signal Pn, to CAM array 38. This transfer operation is performed when a current is carried to the chip, for example. After the transfer of the signals to CAM array 38, CAM array 38 can detect the consistency between an input address and a program address at high rate.

In this case, by activating a control signal BR, the data which is programmed in program array 36 once can be fixed to the data which cannot be rewritten. Thereby, a high voltage is applied to bit lines for a selected word line and the lower resistance MTJ element of memory cell 361 or 362 is destroyed. Likewise, the data can be fixed by destroying the lower resistance MTJ element of memory cell 363 or 364 storing a program address. If a high voltage SVCC is applied from the outside of nonvolatile semiconductor memory device 1 through pad 34 shown in FIG. 1 to activate control signal BR, high voltage SVCC is supplied to word driver 305 as a power supply therefor. To destroy the MTJ element included in, for example, memory cell 361, write driver 303 is deactivated and high voltage SVCC is applied to bit line 351 by word driver 305.

Figure 7:
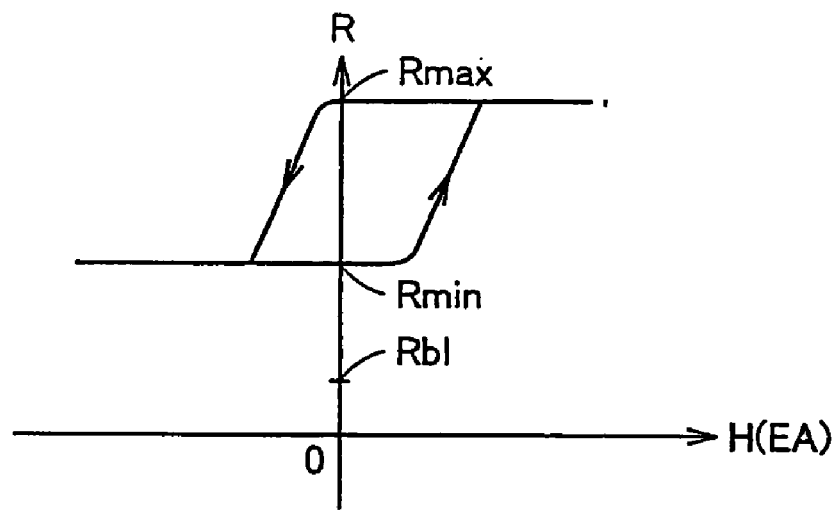
FIG. 7 shows the change of the resistance value of a normal MTJ element.

FIG. 7 shows the change of the resistance value of a normal MTJ element.

With reference to FIG. 7, a magnetic field H changes if a current is carried to the digit line. The resistance of the MTJ element of the memory cell changes between high resistance Rmax and low resistance Rmin. If high voltage SVCC is applied, the MTJ element is destroyed and the resistance value of the MTJ element becomes Rb1 which is far lower than low resistance Rmin.

Figure 8:
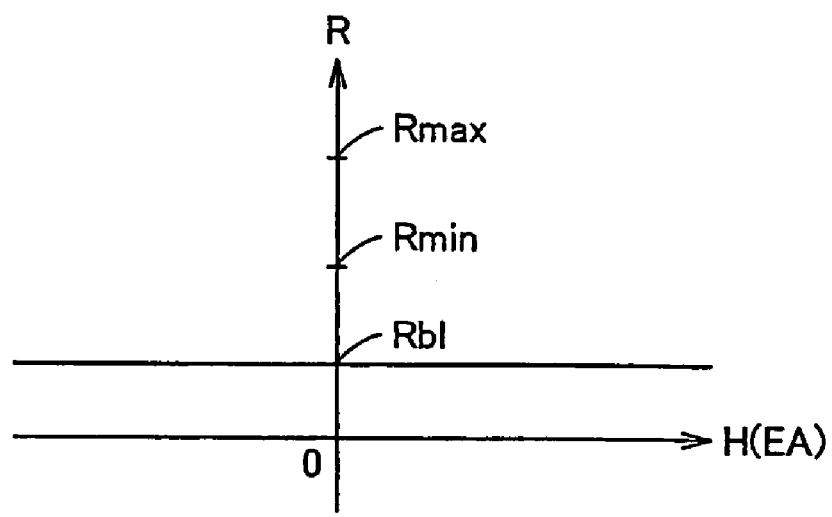
FIG. 8 shows the change of the resistance value of the MTJ element which has data fixed.

FIG. 8 shows the change of the resistance value of an MTJ element after data is fixed.

With reference to FIG. 8, once high voltage SVCC is applied to thereby destroy the MTJ element, the resistance value of the MTJ element remains Rb1 even if a current is carried to the digit line and magnetic field H changes. If replacement information is stored in two memory cells complementary to each other and the memory cell which is set at low resistance Rmin is destroyed, the result detected by the sense amplifier is normal even when the resistance value of the complementary memory cell is changed from Rmax to Rmin by the application of a ferromagnetic field. That is, since resistance value Rb1 is lower than both Rmax and Rmin, it is possible to fix a read result by further decreasing the resistance of the lower resistance-side memory cell.

As a result, even if a ferromagnetic field is applied during transport or the like after replacing and relieving a defective memory cell, the replacement information does not change.

With reference to FIG. 6 again, it is also possible to detect whether or not an MTJ element is destroyed after a normal relieving step. It is assumed that the MTJ element of memory cell 361 is destroyed. In this case, while control signal BR is inactive, opposite data may be written to memory cell 361 by an ordinary MRAM rewrite method to determine whether or not the written data can be read as an expected value. Specifically, memory cell 361 may be rewritten into a high resistance state and memory cell 362 may be rewritten into a low resistance state.

If the written data can be read as the expected value, it can be determined that memory cell 361 is not destroyed. If opposite data is written to memory cell 361 and the state can be fixedly read, then it can be determined that memory cell 361 is a destroyed program set. Thereby, if a failure which generates after a normal relieving step is to be relieved, it is possible to program a defective address in program array 36 while avoiding the already destroyed program set.

As can be understood from the above, by preparing a flag for each program set, it is possible to determine the used state of the program set. Further, by constituting program array 36 so that a high voltage can be applied thereto, it is possible to fix the replacement information stored in program array 36 to one which cannot be rewritten. The fixing state can be detected by reading the flag for the corresponding program set.

Figure 9:
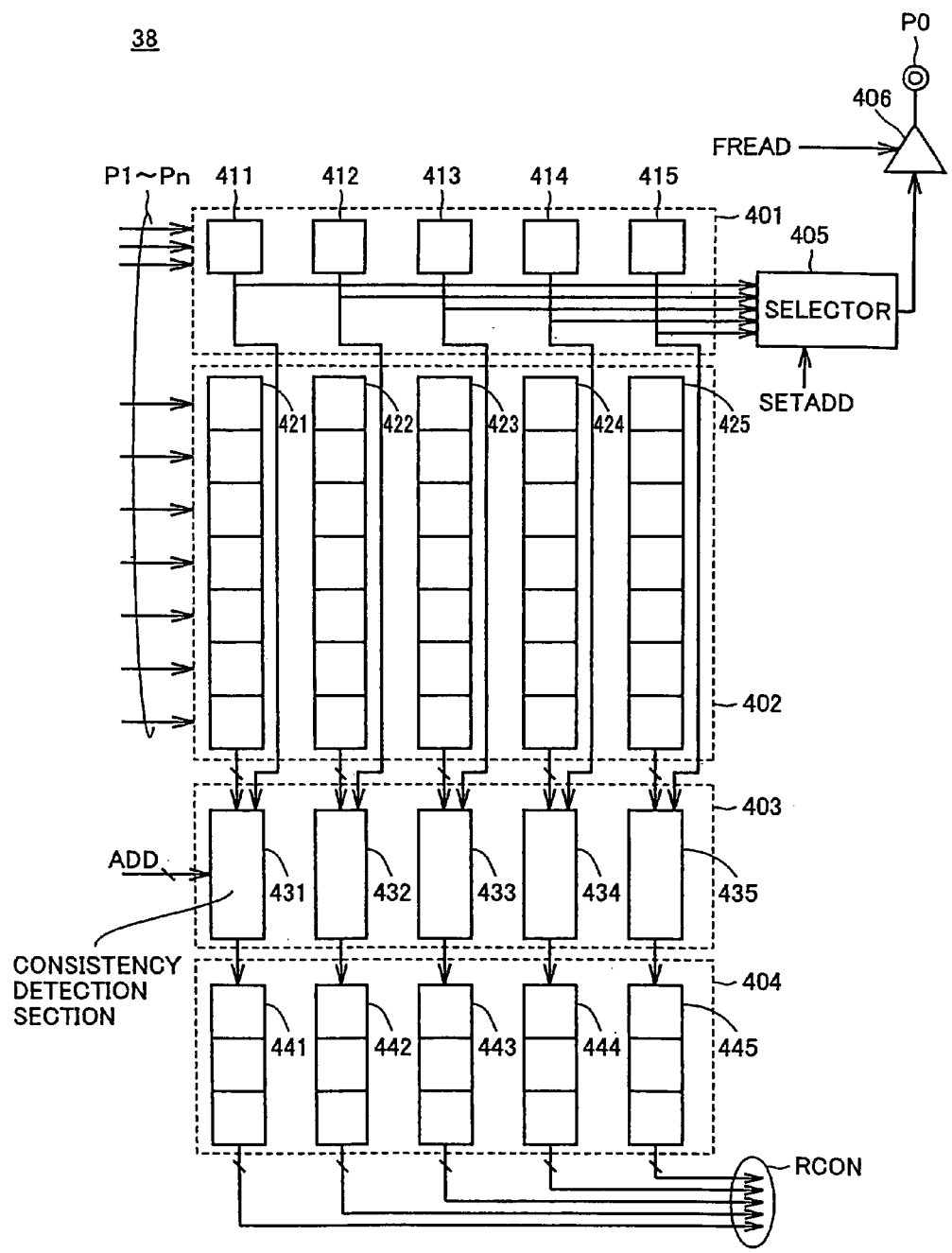
FIG. 9 is a circuit diagram showing the configuration of a CAM array 38 shown in FIG. 1.

FIG. 9 is a circuit diagram showing the configuration of CAM array 38 shown in FIG. 1.

With reference to FIG. 9, CAM array 38 includes a flag storage section 401, an address storage section 402, a consistency detection section 403, and a storage section 404 which stores the location of a spare memory cell column to be used.

Flag storage section 401 includes five latch circuits 411 to 415 corresponding to five program sets which store different replacement information. Address storage section 402 includes program sets 421 to 425 corresponding to latch circuits 411 to 415, respectively. Consistency detection section 403 includes consistency detection sections 431 to 435 corresponding to program sets 421 to 425, respectively. Storage section 404 includes storage units 441 to 445 which are activated in accordance with the outputs of consistency detection sections 431 to 435. The outputs of storage units 441 to 445 become control signal RCON.

Signals P1 to Pn outputted from program array 36 as already described above with reference to FIG. 6 are inputted into flag storage section 401 and address storage section 402 and held in the latch circuits. The output of flag storage section 401 is outputted to consistency detection section 403 and to a selector 405.

Whether effective addresses are already stored in program sets 421 to 425 can be read to the outside by outputting the outputs of latch circuits 411 to 415 from a terminal PO through selector 405 and an output circuit 406. Thereby, if a replacement address is added, it is possible to prevent data from being written to the already used address set.

Selector 405 selects one of the outputs of latch circuits 411 to 415 in accordance with a set address SETADD for specifying one of program sets 421 to 425. Output circuit 406 is activated in accordance with a signal FREAD activated in a test mode to thereby output the output of selector 405 to terminal PO.

Figure 10:
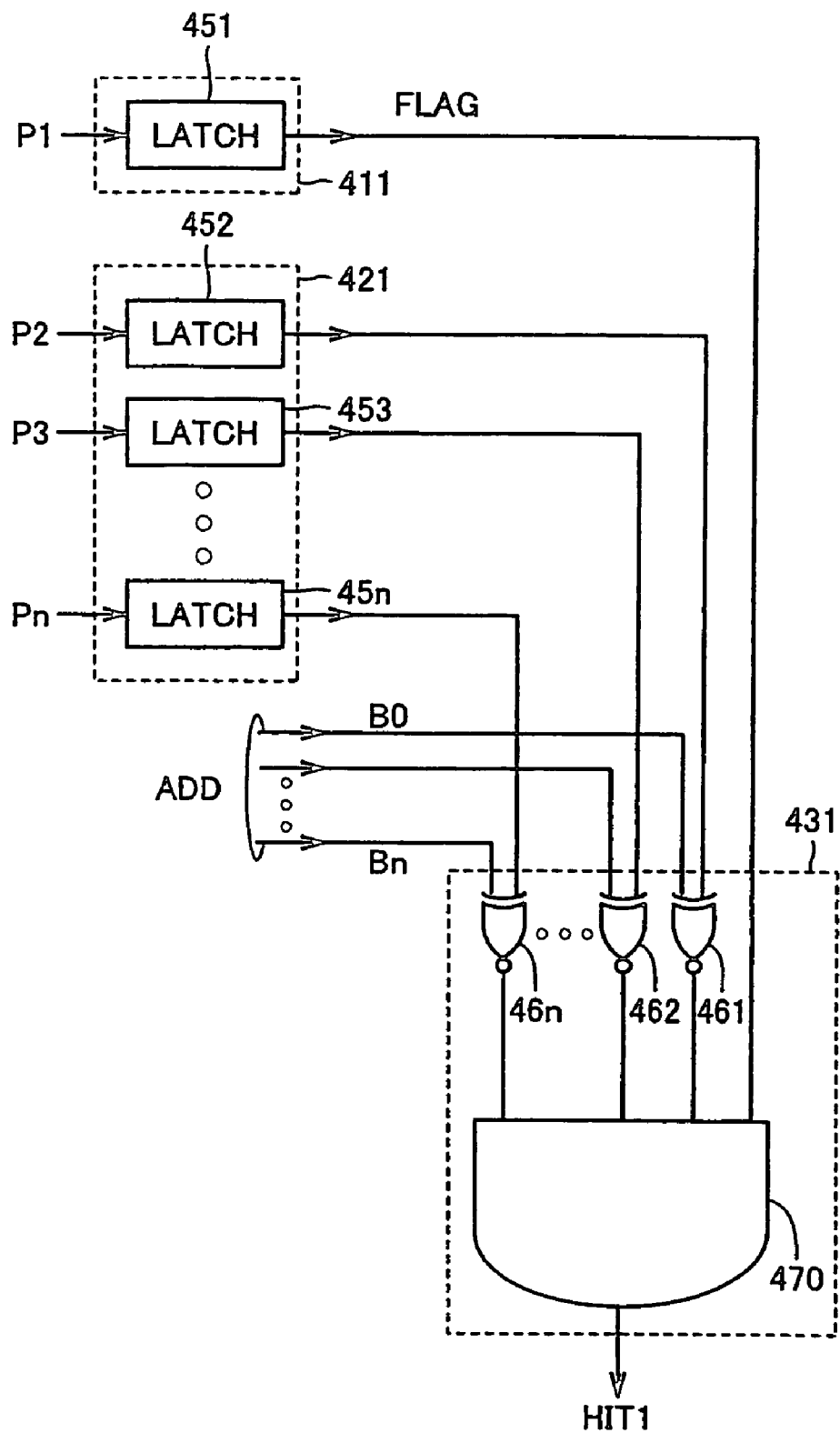
FIG. 10 is a circuit diagram showing the configuration of a consistency detection section 431 shown in FIG. 9.

FIG. 10 is a circuit diagram showing the configuration of consistency detection section 431 shown in FIG. 9.

With reference to FIG. 10, consistency detection section 431 receives a flag signal FLAG corresponding to program set 421 in flag storage section 402, the outputs of latches 452 to 45n included in program set 421 and inputted address signal ADD. Latch 452 holds the least significant bit of the replacement address and latch 45n holds the most significant bit thereof.

Consistency detection section 431 includes consistency detection circuits 461 to 46n each of which performs comparison between a replacement address outputted from program set 421 and an input address signal in every bit, and an AND circuit 470 receiving a signal FLAG and the outputs of consistency detection circuits 461 to 46n and outputting a signal HITI.

With reference to FIG. 9 again, consistency detection sections 431 to 435 determine whether the outputs of program sets 421 to 425 in which corresponding flags are activated coincide with inputted addresses. According to the determination results, selector 84 performs a select operation during data read.

With the configuration shown in FIG. 9, five program sets are provided. With the configuration of the array shown in FIG. 2, by contrast, three spare memory cell columns are provided. Two out of the three spare memory cell columns are connected to IO line pairs IOP4 and IOP5. That is, the number of columns which are replaced simultaneously to correspond to one access is two and the number of the outputs of consistency detection sections 431 to 435 which are simultaneously activated is a maximum of 2.

Here, selector 84 shown in FIG. 2 performs a select operation to connect two out of three spare memory cell columns 71 to 73 to the IO line pairs in accordance with the contents held in storage units 441 to 445 included in storage section 404. Further, to connect IO line pairs IOP1 to IOP5 to sense amplifiers 101 to 103, the IO line pair corresponding to the address of a defective column is made unconnected and the data read from the spare bit line is transmitted to the sense amplifier through the spare column-dedicated IO line pair.

Similarly, during data write, the write driver for the bit line connected to the detected defective memory cell is deactivated and the write data is transmitted to the write driver for the spare bit line.

As described above, the number of program sets and that of spare memory cell columns do not always have a one-by-one correspondence. The number of program sets can be arbitrarily selected relative to that of redundant spare memory cell columns. By providing flag bits, it is possible to detect an unused program set when a replacement address is added. In addition, the flexibility for the selection of the number of redundant memory cells and that of program sets each storing a replacement address increases.

Figure 11:
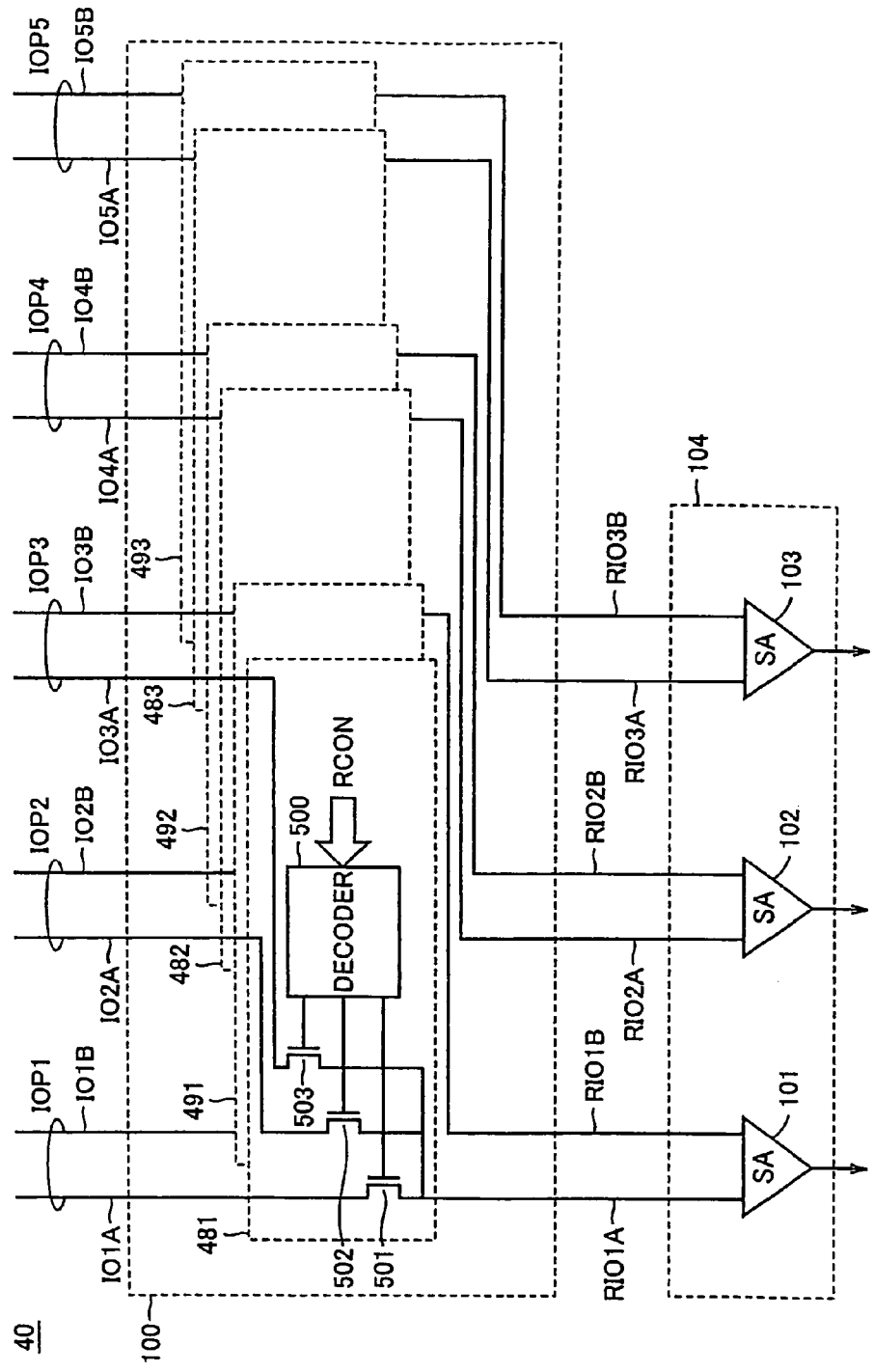
FIG. 11 is a circuit diagram showing the configuration of a select and amplification section 40 shown in FIG. 1.

FIG. 11 is a circuit diagram showing the configuration of select and amplification section 40 shown in FIG. 1.

With reference to FIG. 11, select and amplification section 40 includes a select section 100 and an amplification section 104. Select section 100 selects three out of the five IO line pairs in accordance with control signal RCON.

To select the IO line pairs, a so-called shift redundancy method is employed. Select section 100 includes a switching circuit 481 which selects one of IO lines IO1A, IO2A and IO3A and connects the selected IO line to an IO line RIO1A, and a switching circuit 491 which selects one of IO lines IO1B, IO2B and IO3B and connects the selected IO line to an IO line RIO1B.

Select section 100 also includes a switching circuit 482 which selects one of IO lines IO2A, IO3A and IO4A and connects the selected IO line to an IO line RIO2A, and a switching circuit 492 which selects one of IO lines IO2B, IO3B and IO4B and connects the selected IO line to an IO line RIO2B.

Further, select section 100 includes a switching circuit 483 which selects one of IO lines IO3A, IO4A and IO5A and connects the selected IO line to an IO line RIO3A, and a switching circuit 493 which selects one of IO lines IO3B, IO4B and IO5B and connects the selected IO line to an IO line RIO3B.

Amplification section 104 includes a sense amplifier 101 which detects the difference between a current carried to the memory cell connected to IO line RIO1A and that carried to the memory cell connected to IO line RIO1B to thereby read stored data, a sense amplifier 102 which detects the difference between a current carried to the memory cell connected to IO line RIO2A and that carried to the memory cell connected to IO line RIO2B to thereby read stored data, and a sense amplifier 103 which detects the difference between a current carried to the memory cell connected to IO line RIO3A and that carried to the memory cell connected to IO line RIO3B to thereby read stored data.

Switching circuit 481 includes a decoder 500 which decodes control signal RCON, connection gates 501, 502 and 503 which connect IO lines IO1A, IO2A and IO3A, respectively to 10 line RIO1A in accordance with the output of decoder 500. Decoder 500 decodes a specific bit of the IO line corresponding to a defective memory cell and a bit for specifying a spare cell column including a spare memory cell which replaces the defective memory cell. Decoder 500 sets one of connection gates 501, 502 and 503 in a connected state based on the decoding result.

By providing the three connection gates per one input node of a sense amplifier, it is possible to perform a two-stage shifting operation. As a result, it is possible to select three out of the five IO line pairs and connect the selected IO line pairs to the three sense amplifiers by using the shift redundancy method.

In the shift redundancy, three out of IO lines IO1A to IO5A are selected and the selected IO lines are connected to IO lines RIO1A to RIO3A, respectively, without changing the arrangement order of the selected IO lines. In addition, three out of IO lines IO1B to IO5B are selected and the selected IO lines are connected to IO lines RIO1B to RIO3B, respectively, without changing the arrangement order of the selected IO lines.

By adopting the shift redundancy configuration, it is possible to prevent the length of connection paths between the input nodes of the sense amplifier and IO lines IO1A to IO5A and IO1B to I05B from greatly differing from one another. It is thereby possible to make load uniform and to make an operation margin uniform.

Second Embodiment

Figure 12:
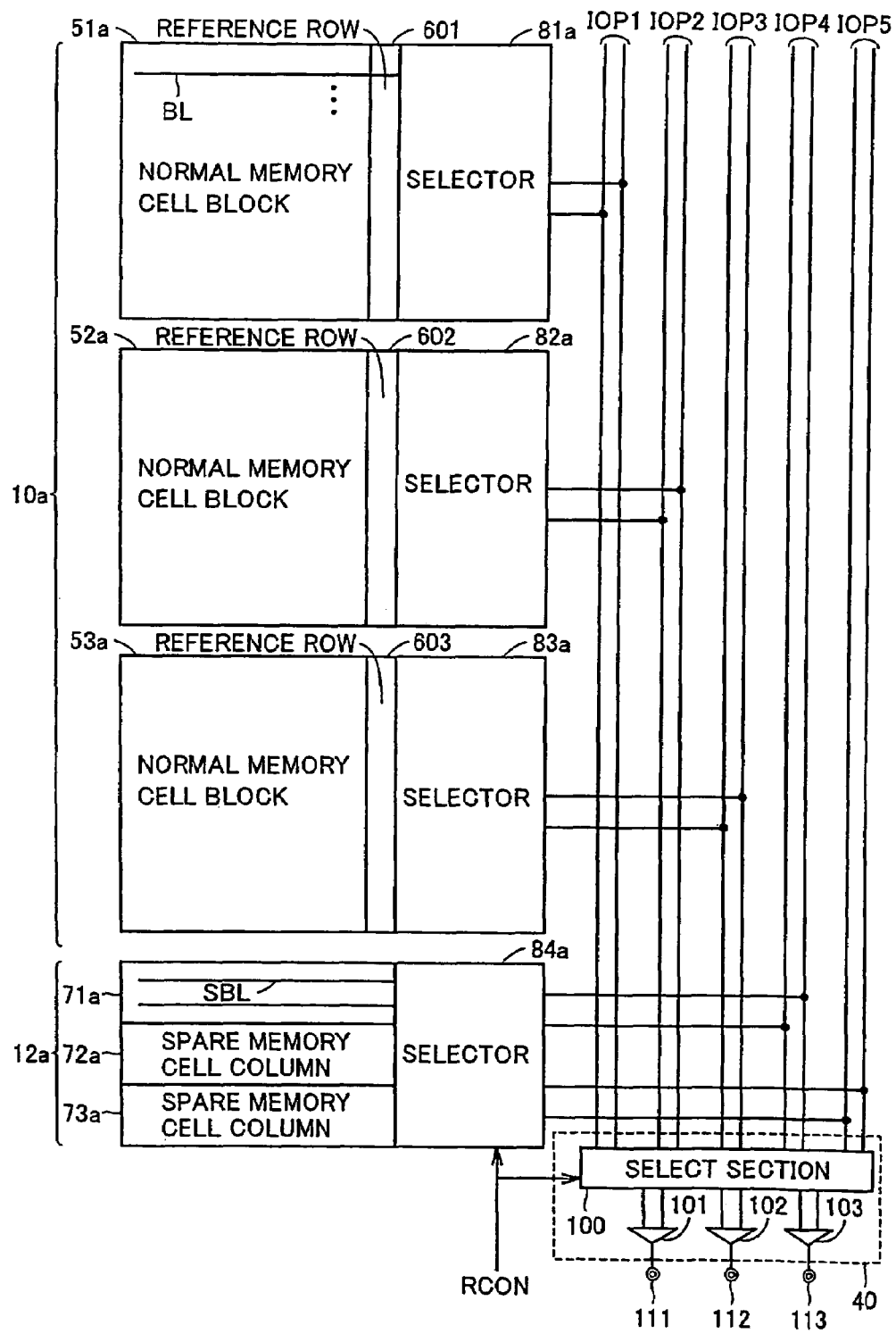
FIG. 12 shows the configuration of a data read system of a nonvolatile semiconductor memory device according to a second embodiment of the present invention.

FIG. 12 is a block diagram of a data read system of a nonvolatile semiconductor memory device according to a second embodiment of the present invention.

With reference to FIG. 12, the nonvolatile semiconductor memory device in the second embodiment differs from that shown in FIG. 2 in that a memory array 10a instead of memory array 10 and a spare memory array 12a instead of spare memory array 12 are provided.

Memory array 10a includes normal memory cell blocks 51a to 53a, reference rows 601 to 603 provided to correspond to normal memory cell blocks 51a to 53a, and selectors 81a to 83a. The output of selector 81a is connected to IO line pair IOP1. The output of selector 82a is connected to IO line pair IOP2. The output of selector 83a is connected to IO line pair IOP3.

Spare memory array 12a includes spare memory cell columns 71a to 73a, and a selector 84a which selects one of spare memory cell columns 71a to 73a in accordance with control signal RCON. The output of selector 84a is connected to IO line pairs IOP4 and IOP5.

Since the configuration of select and amplification section 40 is the same as that described with reference to FIG. 2, it will not be repeatedly described herein.

The second embodiment is the same as the first embodiment in that two spare bit lines SBL are arranged in each spare cell column and two spare cells store data of one bit as a whole. The second embodiment, however, differs from the first embodiment in that reference rows 601 to 603 each holding a reference value during data read are arranged in parallel to the word lines of the normal memory cell blocks.

Selectors 81a to 83a are provided to correspond to normal memory cell blocks 51a to 53a, respectively. In addition, IO line pairs IOP1 to IOP3 are provided to correspond to normal memory cell blocks 51a to 53a, respectively.

The output of selector 81a is connected to IO line pair IOP1. A corresponding memory cell in normal memory cell block 51a is connected to one of the IO lines in IO line pair IOP1 through selector 81a. A corresponding memory cell in reference row 601 is connected to the other IO line in IO line pair IOP1 through selector 81a.

The output of selector 82a is connected to IO line pair IOP2. A corresponding memory cell in normal memory cell block 52a is connected to one of the IO lines in IO line pair IOP2 through selector 82a. A corresponding memory cell in reference row 602 is connected to the other IO line in IO line pair IOP2 through selector 82a.

The output of selector 83a is connected to IO line pair IOP3. A corresponding memory cell in normal memory cell block 53a is connected to one of the IO lines in IO line pair IOP3 through selector 83a. A corresponding memory cell in reference row 603 is connected to the other IO line in IO line pair IOP3 through selector 83a.

In FIG. 12, a case where the three IO line pairs and the three normal memory cell blocks are provided is shown. However, as long as the number of normal memory cell blocks is equal to that of corresponding IO line pairs, the number of normal memory cell blocks and that of IO line pairs may be larger or smaller than 3. An accessed memory cell in the normal memory cell block is connected to one IO line in the corresponding IO line pair and a memory cell in the corresponding reference row is connected to the other IO line in the corresponding IO line pair.

Selector 84a selects a part of spare memory cell columns 71a to 73a. Selector 84a selects two out of the three spare memory cell columns in accordance with control signal RCON outputted from the CAM array and connects the selected spare memory cell columns to two IO line pairs IOP4 and IOP5, respectively.

Each spare memory cell column is constituted so that two memory cells store data of one bit as a whole. Two spare bit lines SBL are provided per spare memory cell column. Selector 84a first selects two out of the three spare memory cell columns to transmit data from these selected spare memory cell columns to spare column-dedicated IO line pairs IOP4 and IOP5. The selection of selector 84a is made in accordance with control signal RCON indicating a redundancy detection result. A spare bit line to be used according to an input address is connected to the spare column-dedicated IO line pair by selector 84a.

If the number of spare cell columns is set equal to that of spare column-dedicated IO line pairs, selector 84a may not be provided. In this case, the data from spare memory array 12a is all outputted up to select section 100. Thereby, it is unnecessary to apply the redundancy detection result to the selector section of a bit line output section, which may possibly accelerate operation rate.

In the second embodiment, however, selector 84a is provided so as to select two out of the three spare memory cell columns when each selected memory cell column is connected to the IO line pair for the following reason. If the number of IO line pairs increases, the area of the nonvolatile semiconductor memory device disadvantageously increases by as much as the increased number of provided IO line pairs.

Thus, memory cells are connected to a total of five line pairs. Five IO line pairs IOP1 to IOP5 are connected to selection and amplification section 40. Select and amplification section 40 includes select section 100 which selects three out of five line pairs IOP1 to IOP5 in accordance with control signal RCON, and sense amplifiers 101 to 103 for reading the data of the memory cells connected to the IO line pairs selected by select section 100. The number of sense amplifiers is set 3 equal to that of data necessary to be outputted to terminals 111 to 113.

The IO line pair to which a defective memory cell detected by the CAM array is connected and the IO line pair connected to an unnecessary spare bit line are not connected to sense amplifiers 101 to 103. Sense amplifiers 101 to 103 are connected to the memory cells which store data corresponding to inputted addresses through the corresponding IO line pairs.

If the memory cell connected to sense amplifiers 101 to 103 are normal memory cells, sense amplifiers 101 to 103 are also connected to a reference memory cell which is present in the corresponding reference memory cell column and compare current values carried to the two memory cells.

If the connected memory cells are spare memory cells, sense amplifiers 101 to 103 compare the values of currents carried to the two complementary memory cells.

As can be seen, in each spare memory cell column, two memory cells store data of one bit as a whole, dedicated IO line pairs for reading data from the spare memory cells are provided, and the spare memory cells are selected depending on which IO line pairs are connected to the sense amplifiers which detect current on the connected IO line pairs.

By adopting this configuration, it is possible to improve the reliability of the spare memory section. In addition, it is possible to simultaneously read data from the normal memory cells and the spare memory cells and to thereby accelerate operation rate. Furthermore, by simultaneously reading up to the data from the IO line pairs provided outside of the memory cell array, it is possible to further accelerate the operation rate.

Figure 13:
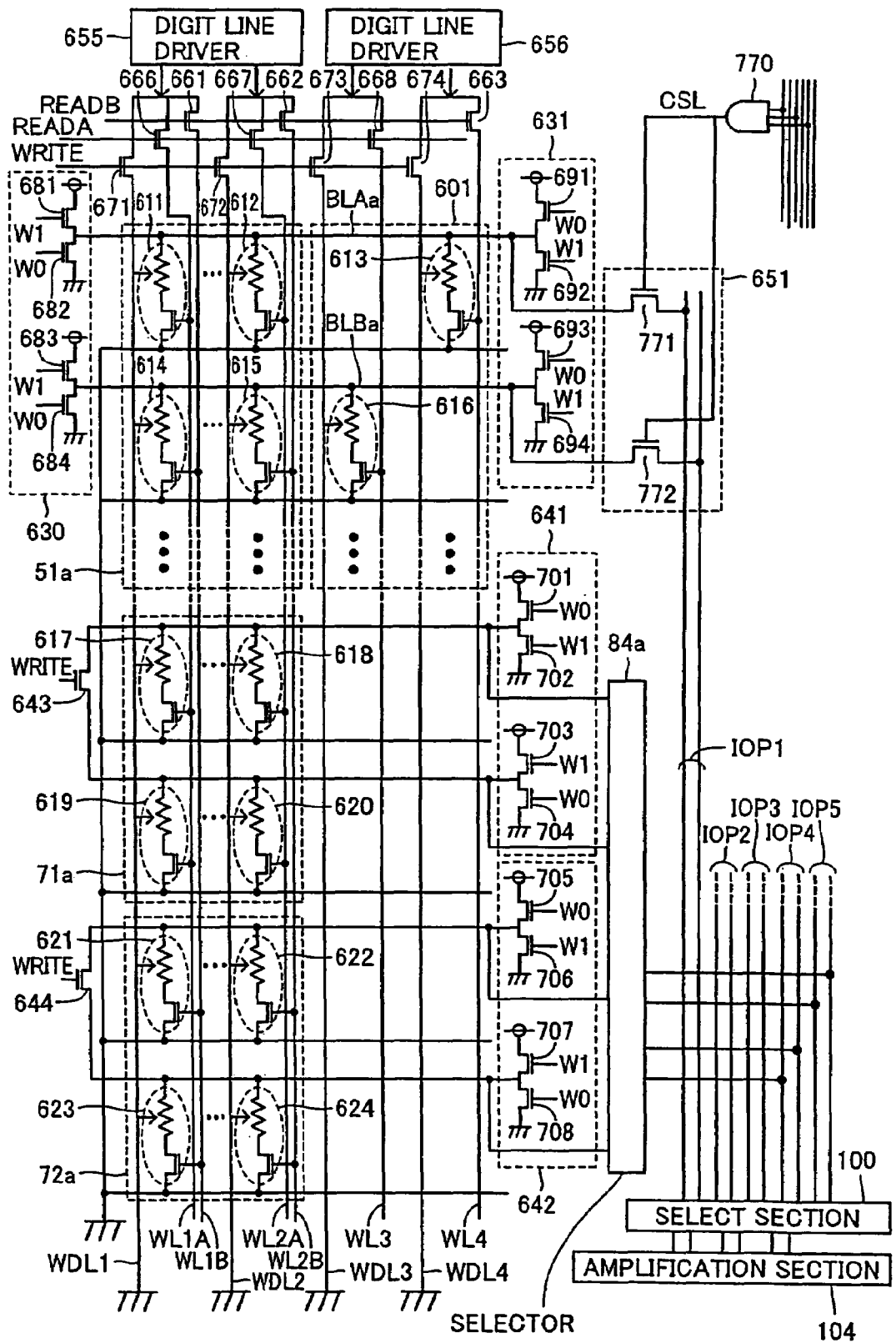
FIG. 13 is a circuit diagram for describing a memory array 10a and a spare memory array 12a described with reference to FIG. 12 in more detail.

FIG. 13 is a circuit diagram for describing memory array 10*a* and spare memory array 12*a* described with reference to FIG. 12 in more detail.

With reference to FIG. 13, description will be given of the configurations with respect to normal memory cell block 51*a* and spare memory cell columns 71*a* and 72*a* shown in FIG. 12.

Normal memory cell block 51*a* includes memory cells 611, 612, 614 and 615. Reference row 601 provided adjacent to normal memory cell block 51*a* includes memory cells 613 and 616.

Write drivers 630 and 631 and a selector 651 are provided to correspond to normal memory cell block 51*a* and reference row 601. Write driver 630 includes transistors 681 to 684. Write driver 631 includes transistors 691 to 694. The driver is denoted by reference symbol W1 which becomes conductive when data "1" is written. The driver is denoted by reference symbol W0 which becomes conductive when data "0" is written.

Two data read word lines are alternately connected to the memory cells in one row. Namely, a word line WL1A is connected to a memory cell 611 and a word line WL1B is connected to a memory cell 614. Likewise, a word line WL2A is connected to a memory cell 612 and a word line WL2B is connected to a memory cell 615. It is noted that a data write digit line WDL1 is provided to be common to each memory cell row. Namely, memory cells 611 and 614 are connected to digit line WDL1 and memory cells 612 and 615 are connected to digit line WDL2.

One word line is provided in each reference row. Namely, a word line WL3 is connected to a memory cell 616 and a word line WL4 is connected to a memory cell 613.

Next, a data read operation for reading data from normal memory cell block 51*a* will be described. Data of memory cells 611 and 612 is read by detecting a current carried from a bit line BLAa to each source line. At this moment, the data of each of memory cells 611 and 612 is compared with that of reference memory cell 616. Due to this, a signal READA is activated to make transistors 666, 667 and 668 conductive. If digit line driver 655 selects a row, memory cell 611 or 612 is selected. At this moment, digit line driver 656 selects word line WL3. As a result, a current is carried to amplification section 104 through gate circuits 771 and 772 included in selector 651, IO line pair IOP1 and select section 100.

On the other hand, in order to read data from memory cells 614 and 615, a signal READAB is activated to thereby make transistors 661, 662 and 663 conductive. In order to select memory cell 614 or 615, digit line driver 655 activates word lines WL1B or WL2B. In order to compare the reference memory cell with the selected normal memory cell, digit line driver 656 activates word line WL4 and selects memory cell 613.

Next, the spare memory cells will be described.

Spare memory cell column 71*a* includes spare memory cells 617 to 620. Spare memory cell column 72*a* includes spare memory cells 621 to 624.

A write driver 641 is provided to correspond to spare memory cell column 71*a*. Write driver 641 includes transistors 701 to 704. A write driver 642 is provided to correspond to spare memory cell column 72*a*. Write driver 642 includes transistors 705 to 708. Among transistors 701 to 708, if the transistor becomes conductive when data "0" is written, the transistor is denoted by reference symbol W0. If the transistor becomes conductive when data "1" is written, the transistor is denoted by reference symbol W1.

If data is written to spare memory cells, then transistors 643 and 644 are made conductive, currents in opposite directions are carried to two spare bit lines by write drivers 641 and 642 and complementary pieces of data are written to the two memory cells. Namely, spare memory cells 617 and 619 store data of one bit as one pair. Spare memory cells 618 and 620 store data of one bit as one pair. Likewise, in spare memory cell column 72*a*, two memory cells store data of one bit as a pair.

If data is read from memory cells 611 and 612, data is read from spare memory cell column 71*a* in parallel to the read of data from memory cells 611 and 612. Namely, if memory cell 611 is selected in response to the activation of word line WL1A, then spare memory cells 617 and 619 are selected and data is read from spare memory cells 617 and 619 by amplification section 104 through selector 84*a*, IO line pairs and select section 100.

Further, if data is read from memory cells 614 and 615, either word line WLL1B or WL2B is activated and data is read from spare memory cell column 72*a* in parallel to the read of data from memory cells 614 and 615.

As described so far, digit lines are provided to be common to the normal memory cells and spare memory cells. Two word lines are alternately connected to the normal memory cells in one row. By thus constituting the reference rows, it is possible to employ the reference memory cell connected to the bit line adjacent the bit line to which the selected normal memory cell is connected. Therefore, the read path becomes equal between the normal memory cells and the reference memory cells, thereby making it difficult to cause a data read error.

Third Embodiment

In recent years, a phase-changing memory has been proposed as a nonvolatile semiconductor memory device. The phase-changing memory is also referred to as "OUM (Ovonic Unified Memory)".

Figure 14:
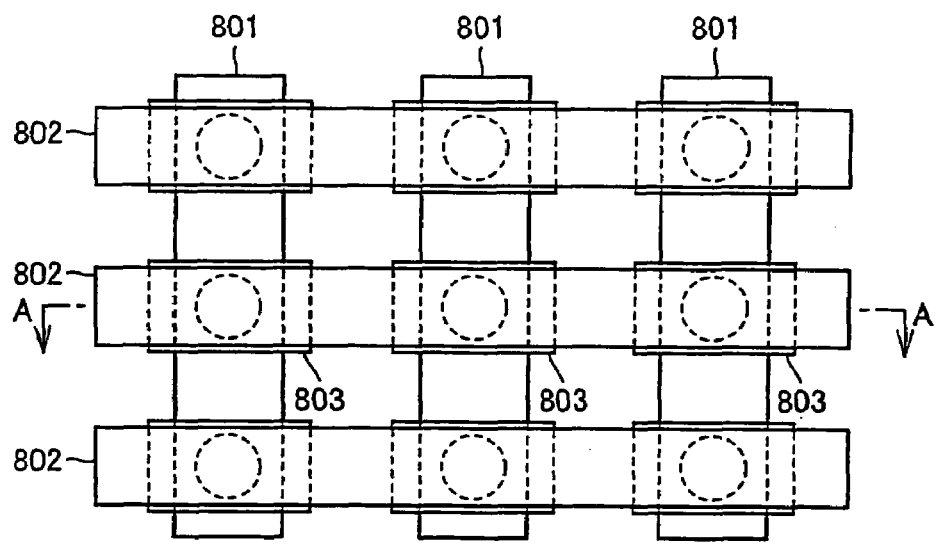
FIG. 14 is a plan view showing the shapes of memory cells in a phase-changing memory.

FIG. 14 is a plan view showing the shapes of memory cells in the phase-changing memory.

Figure 15:
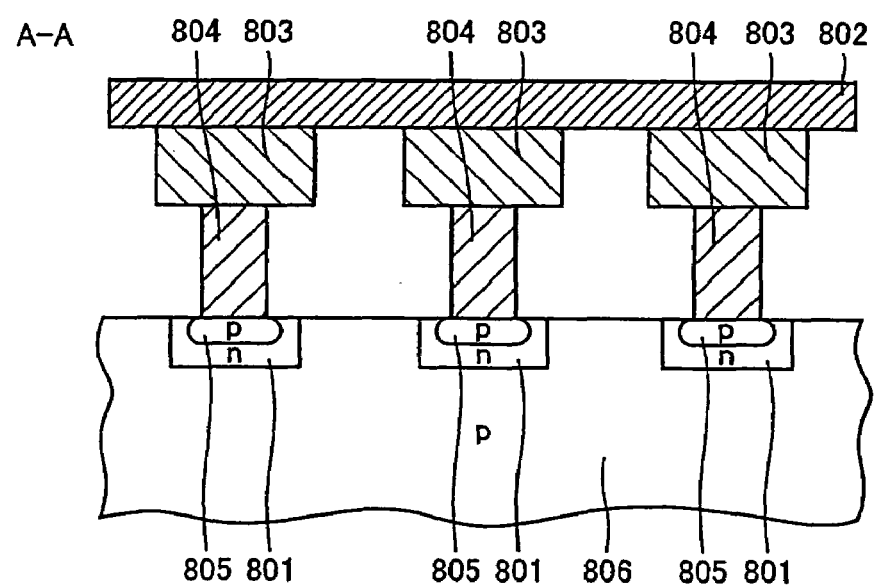
FIG. 15 is a cross-sectional view taken along line A-A of FIG. 14.

FIG. 15 is a cross-sectional view taken along line A-A of FIG. 14.

With reference to FIGS. 14 and 15, a word line 801 is formed of an n-type impurity region on a P-type substrate 806 and a p-type impurity region 805 is formed above word line 801. Substrate 806, word line 801 and impurity region 805 form a vertical PNP type parasitic bipolar transistor.

A heater element 804 is formed above p-type impurity region 805, a chalcogenide layer 803 is formed above heater element 804 and a bit line 802 is formed above chalcogenide layer 803.

Chalcogenide is germanium-selenium-tellurium alloy. Even a small amount of chalcogenide can be transformed between an amorphous state and a crystal state by heating the chalcogenide by a resistor. The resistance of chalcogenide is high in an amorphous state and low in a crystal state.

Figure 16:
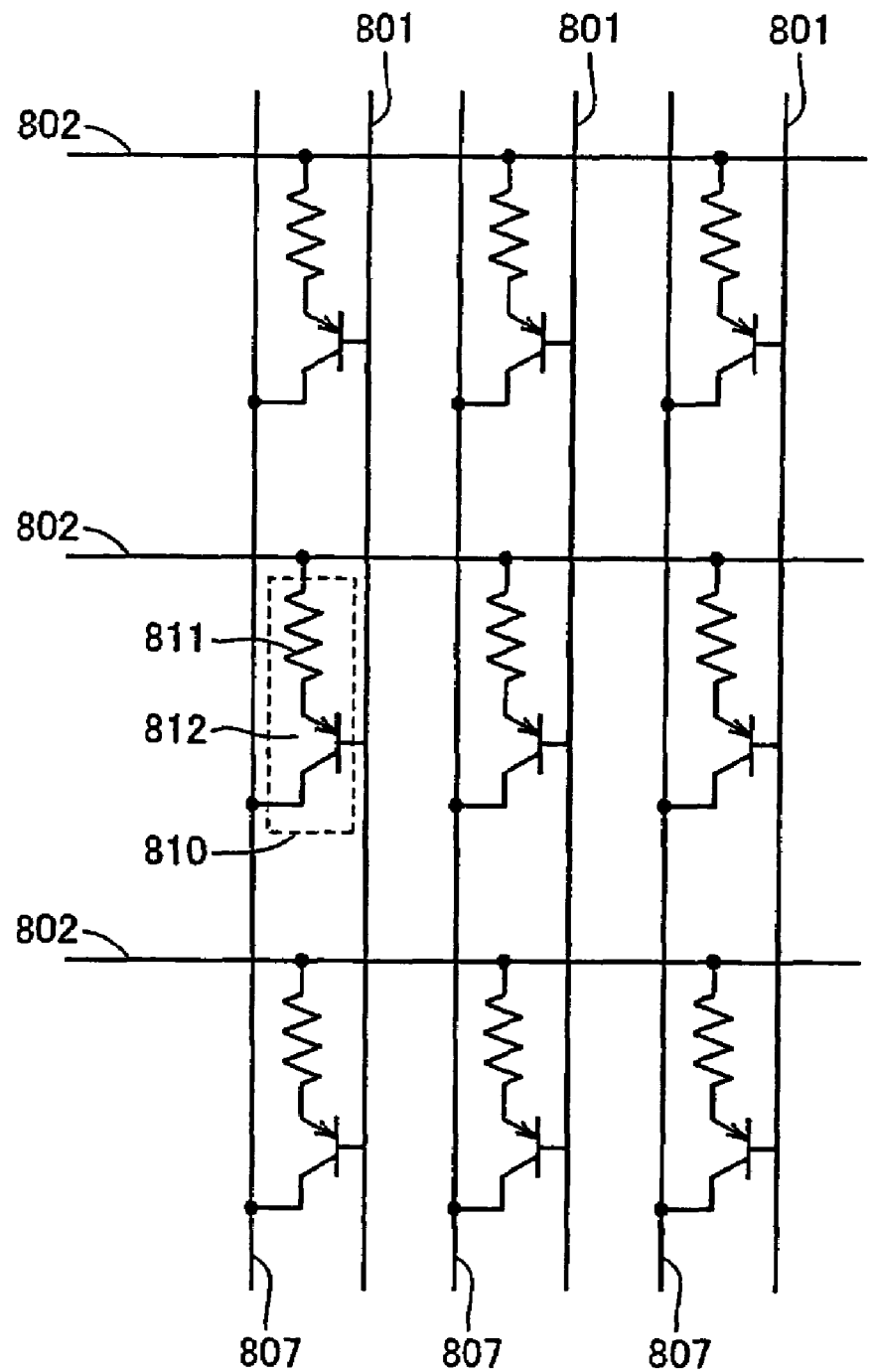
FIG. 16 is an equivalent circuit diagram of the memory cell array shown in FIG. 14.

FIG. 16 is an equivalent circuit diagram of the memory cell array shown in FIG. 14.

With reference to FIG. 16, a memory cell 810 includes a chalcogenide layer 811 and a PNP type bipolar transistor 812. A memory cell is selected by a word line 801 and a current is carried from a bit line 802 to a collector line 807 of the selected memory cell. Depending on the value of the current carried to collector line 807 and current carrying time, the quantity of emitted heat of a heater electrode provided in contact with chalcogenide layer 811 is controlled to make it possible to transform the state of chalcogenide layer 811 between a crystal state and an amorphous state.

Figure 17:
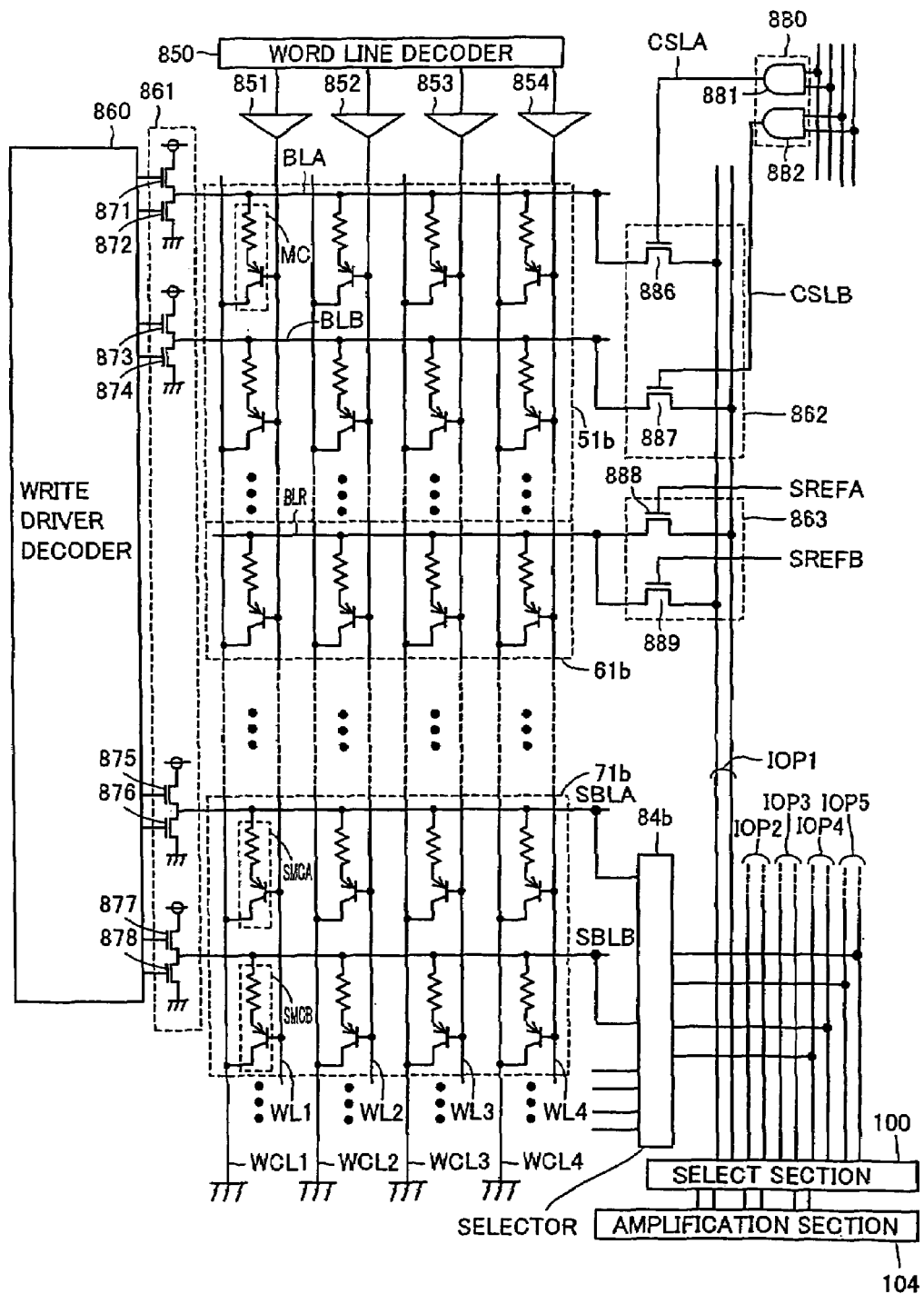
FIG. 17 is a circuit diagram showing a case where the present invention is applied to a phase-changing memory.
Figure 18:
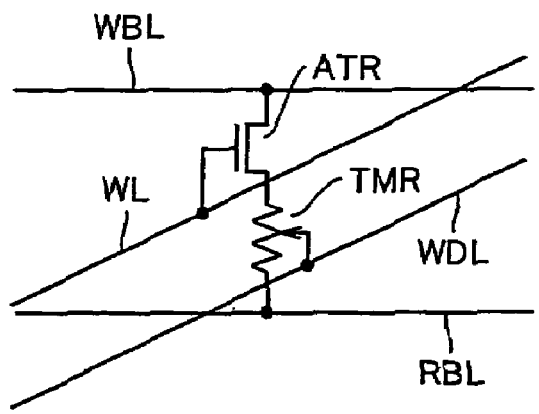
FIG. 18 is a schematic diagram showing the configuration of a memory cell having a tunnel junction.
Figure 19:
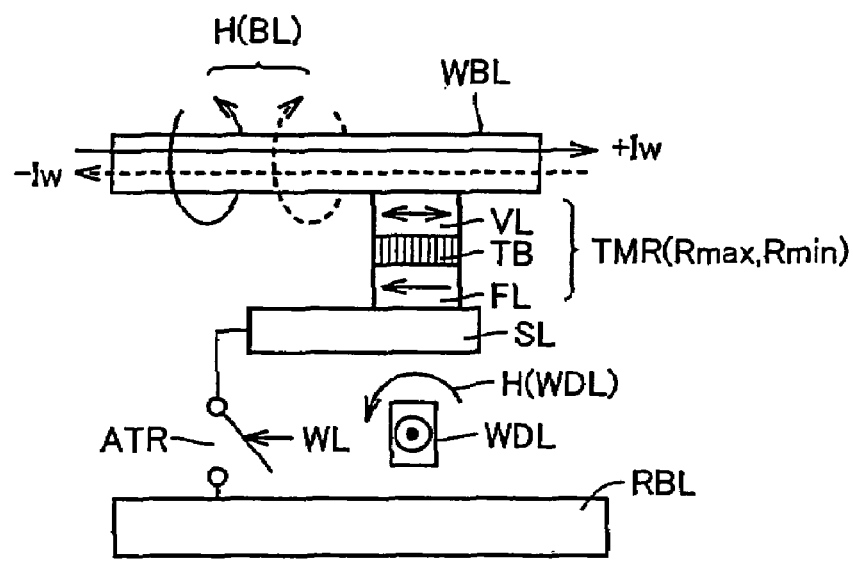
FIG. 19 is a conceptual view for describing a data write operation for writing data to an MTJ memory cell.
Figure 20:
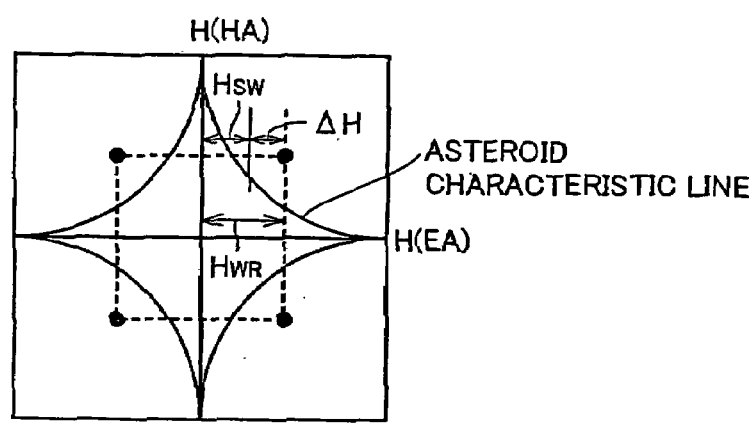
FIG. 20 is a conceptual view for describing the relationship between a data write current and the magnetic direction of a tunneling magneto-resistance element during data write.
Figure 21:
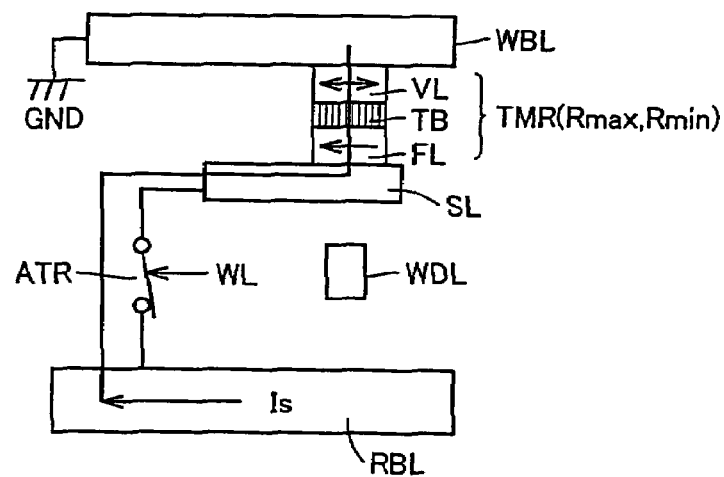
FIG. 21 is a conceptual view for describing a data read operation for reading data from the MTJ memory cell.

FIG. 17 is a circuit diagram showing a case where the present invention is applied to the phase-changing memory.

With reference to FIG. 17, memory cells MC arranged in a matrix are provided in a normal memory cell block 51b. A reference cell column 61b which holds a reference value when data is read from normal memory cell block 51b is provided adjacent to normal memory cell block 51b. Two memory cells store data of one bit as a whole in a spare memory cell column 71b. Spare memory cells SMCA and SMCB hold complementary values to each other. As a result, a spare memory cell does not require a reference memory cell and the reliability of the spare memory cell becomes higher than that of a normal memory cell.

Word lines WL1 to WL4 are provided to be common to normal memory cell block 51b, reference cell column 61b and spare memory cell column 71b. Word lines WL1 to WL4 are driven by word line drivers 851 to 854, respectively. Word line drivers 851 to 854 are selectively activated by a word line decoder 850 in accordance with an address signal. Bit lines BLA, BLB, SBLA and SBLB are driven by a write driver 861 during data write. Write driver 861 includes transistors 871 to 878.

The gates of transistors 871 to 878 are driven by a write driver decoder 860. Write driver decoder 860 changes the potentials of bit lines and driving time according to write information so as to change the phase of the chalcogenide layer of each memory cell.

During data read, a corresponding bit line is selected by decoder 880 and a read gate 862 and one of gate circuits 886 and 887 is connected to one of IO lines in an IO line pair.

If signal CSLA is selected by a decoder gate 881, signal SREFA is activated and a reference memory cell is connected to the other IO line in the IO line pair by a gate circuit 888.

Conversely, if signal CSLB is activated by decoder gate 882, bit line BLB is connected to one IO pair in the IO line pair by gate circuit 887. In this case, signal SREFB is activated to make gate circuit 889 conductive and bit line BLR is connected to the other IO line in the IO line pair.

In order to uniformly distribute the junction capacities of gate circuits 886 and 887 connected to the IO line pairs, the bit lines and IO line pairs are alternately connected to one another. Due to this, reference bit line BLR is also connected to one of the IO line in the IO line pair to correspond to the selected normal memory cell column.

Since the spare memory cell columns are constituted so that two memory cells store data of one bit as a whole, opposite pieces of data are written simultaneously to the two memory cells selected by the same word line. As in the case of the configuration described with reference to FIG. 3, three spare memory cell columns are provided. FIG. 17 typically shows one memory cell column 71b. A selector 84b selects two out of the three spare memory cell columns and the selected spare memory cell column is connected to spare column-dedicated IO line pairs IOP4 and IOP5.

In normal memory cell block 51b which stores data of one bit per memory cell, an accessed memory cell is compared with a memory cell in reference cell column 61b to thereby read data. If a word line is activated, decoder 880 and read gate 862 select the bit line to which the accessed memory cell is connected. The selected bit line is also connected to IO line pair IOP1. A precharge current is carried to the bit line and the selected memory cell through the IO line pair and the state of a sense amplifier changes according to the resistance value of the selected memory cell. The memory cell in reference cell column 61b is simultaneously selected by the same word line as that for the accessed memory cell. Bit lines for the both memory cells are connected to amplification section 104 and the state of the accessed memory cell and that of the reference memory cell are compared with each other.

On the other hand, since the spare memory cell column is constituted to store data of one bit by two memory cells as a whole, it does not require a reference memory cell. In this way, by constituting the redundancy section to hold and store complementary data of one bit in two memory cells, it is possible to operate the spare memory cell array more stably even if there is a variation in finished dimensions of elements between the access memory cells and the reference memory cells.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
   a plurality of normal memory cells each storing data of one bit in a nonvolatile mannner;
   a plurality of spare memory cells each used in place of a defective memory cell when the defective memory cell is present in said plurality of normal memory cells, and constituted so that two spare memory cells store data of one bit as a whole;
   a control circuit, in accordance with an external access, selecting a first memory cell group corresponding to an address signal from among said plurality of normal memory cells and selecting a second memory cell group from among said plurality of spare memory cells in parallel to selection of said first memory cell group; and a select and amplification section selecting a read memory cell group in accordance with said address signal from among said first and second memory cell groups, and amplifying and outputting the data held in said read memory cell group, wherein said plurality of normal memory cells are arranged in rows and columns, and said nonvolatile semiconductor memory device further comprising:

a plurality of word lines provided along said rows of said plurality of normal memory cells;

a plurality of bit lines provided along said columns of said plurality of normal memory cells;

a plurality of reference memory cells provided adjacent to a region in which said plurality of normal memory cells are arranged, arranged to form columns along a column direction of said plurality of normal memory cells, and each holding a reference value for determining a read value when the data is read from each of said normal memory cells;

first and second data lines, one of the first and second data lines being connected to one of said plurality of normal memory cells and the other being connected to one of said plurality of reference memory cells; and third and fourth data lines connected to first and second spare memory cells, among said plurality of spare memory cells, forming a pair and storing predetermined data of one bit as the pair.

2. A nonvolatile semiconductor memory device comprising:

a plurality of normal memory cells each storing data of one bit in a nonvolatile manner;

a plurality of spare memory cells each used in place of a defective memory cell when the defective memory cell is present in said plurality of normal memory cells, and constituted so that two spare memory cells store data of one bit as a whole;

a control circuit, in accordance with an external access, selecting a first memory cell group corresponding to an address signal from among said plurality of normal memory cells and selecting a second memory cell group from among said plurality of spare memory cells in parallel to selection of said first memory cell group; and a select and amplification section selecting a read memory cell group in accordance with said address signal from among said first and second memory cell groups, and amplifying and outputting the data held in said read memory cell group, wherein said plurality of normal memory cells are arranged in rows and columns, and said nonvolatile semiconductor memory device further comprising:

a plurality of digit lines each provided corresponding to each of said rows of said plurality of normal memory cells; and a plurality of word lines, two word lines provided corresponding to each of said rows of said plurality of normal memory cells, for selecting the rows during data read, said plurality of normal memory cells in each row are alternately connected to corresponding two of said word lines, and said nonvolatile semiconductor memory device further comprising:

a plurality of reference memory cells provided adjacent to a region in which said plurality of normal memory cells are arranged, arranged to form rows along a row direction of said plurality of normal memory cells, and each holding a reference value for determining a read value when reading the data from each of said normal memory cells.

* * * * *